US012713975B2

(12) United States Patent
Im

(10) Patent No.: US 12,713,975 B2
(45) Date of Patent: Aug. 18, 2026

(54) SEMICONDUCTOR DEVICE INCLUDING JOINT PORTION BETWEEN CONDUCTIVE CONNECTION STRUCTURES AND METHOD OF FABRICATING THE SAME

(71) Applicant: SK hynix Inc., Gyeonggi-do (KR)

(72) Inventor: Mir Im, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 1038 days.

(21) Appl. No.: 17/864,092

(22) Filed: Jul. 13, 2022

(65) Prior Publication Data

US 2023/0260956 A1 Aug. 17, 2023

(30) Foreign Application Priority Data

Feb. 16, 2022 (KR) ........................ 10-2022-0020448

(51) Int. Cl.
*H10W 90/00* (2026.01)
*H10W 80/00* (2026.01)

(52) U.S. Cl.
CPC .......... *H10W 90/00* (2026.01); *H10W 80/165* (2026.01); *H10W 80/312* (2026.01); *H10W 80/327* (2026.01); *H10W 90/792* (2026.01)

(58) Field of Classification Search
CPC ..... H01L 24/80; H01L 24/08; H01L 25/0657; H01L 25/18; H01L 25/50; H01L 2224/08145; H01L 2224/80895; H01L 2224/80896; H01L 2924/05341
See application file for complete search history.

(56) References Cited

U.S. PATENT DOCUMENTS

| | | | | |
|---|---|---|---|---|
| 10,679,854 | B2 | 6/2020 | Guo et al. | |
| 10,910,782 | B2 | 2/2021 | Vandroux et al. | |
| 2022/0093547 | A1* | 3/2022 | Elsherbini | H01L 25/0657 |
| 2022/0208706 | A1* | 6/2022 | Jang | H01L 23/3192 |

* cited by examiner

*Primary Examiner* — Thanh Y. Tran
(74) *Attorney, Agent, or Firm* — IP & T GROUP LLP

(57) ABSTRACT

In an embodiment, a method of fabricating a semiconductor device includes providing a first substrate structure, the first substrate structure including a first substrate body, a first conductive connection structure and a first two-dimensional inorganic layer having negative charges disposed adjacent to each other over the first substrate body, providing a second substrate structure, the second substrate structure including a second substrate body, a second conductive connection structure and a second two-dimensional inorganic layer having negative charges disposed adjacent to each other over the second substrate body, and joining the first and second substrate structure to each other such that the first conductive connection structure and the second conductive connection structure are connected to each other, and the first two-dimensional inorganic layer and the second two-dimensional inorganic layer are joined to each other.

11 Claims, 27 Drawing Sheets

SEMICONDUCTOR DEVICE INCLUDING JOINT PORTION BETWEEN CONDUCTIVE CONNECTION STRUCTURES AND METHOD OF FABRICATING THE SAME

CROSS-REFERENCE TO RELATED APPLICATIONS

The present application claims priority under 35 U.S.C 119(a) to Korean Application No. 10-2022-0020448, filed on Feb. 16, 2022, which is incorporated herein by reference in its entirety.

BACKGROUND

1. Technical Field

The present disclosure generally relates to a semiconductor device including joint portions between conductive connection structures and to a method of fabricating the same.

2. Related Art

Recently, a method of fabricating a semiconductor device has been proposed by respectively forming integrated circuits on different first and second substrates, and joining the first and second substrates to connect the integrated circuits to each other. For example, conductive pillars or conductive pads respectively disposed on the first and second substrates are joined to each other, so that the integrated circuits of the first and second substrates may be electrically connected to each other.

In this case, the structural and electrical reliability of the semiconductor device may be determined by the alignment state and joint state between the conductive pillars or conductive pads of the first and second substrates. This method presents many new challenges which need to be overcome for the method to become practical.

SUMMARY

In a method of fabricating a semiconductor device according to an embodiment of the present disclosure, a first substrate structure and a second substrate structure may be provided. The first substrate structure may include a first substrate body, and a first conductive connection structure and a first two-dimensional inorganic layer disposed adjacent to each other over the first substrate body. The first two-dimensional inorganic layer has negative charges. The second substrate structure may include a second substrate body, and a second conductive connection structure and a second two-dimensional inorganic layer disposed adjacent to each other over the second substrate body. The second two-dimensional inorganic layer has negative charges. The first and second substrate structures may be joined to each other such that the first conductive connection structure and the second conductive connection structure are connected to each other. The first two-dimensional inorganic layer and the second two-dimensional inorganic layer may be joined to each other in a joint portion of the first and second substrate structures.

A semiconductor device according to another embodiment of the present disclosure may include a substrate body, first wiring and second wiring disposed over the substrate body and spaced apart from each other in a height direction substantially perpendicular to a surface of the substrate body, and a connection portion electrically connecting the first and second wirings to each other over the substrate body. The connection portion may include first and second joint portions disposed adjacent to each other. The first joint portion may include joint of first and second conductive connection structures in the height direction, and the second joint portion may include joint of first and second two-dimensional inorganic layers in the height direction.

There is disclosed a method of fabricating a semiconductor device according to an embodiment of the present disclosure. In the method, a first substrate structure may be provided, the first substrate structure including a first substrate, a memory cell drive circuit disposed on the first substrate, a first conductive connection structure electrically connected to the memory drive circuit over the first substrate, and a first two-dimensional inorganic layer disposed adjacent to the first conductive connection structure and the first two-dimensional inorganic layer having negative charges. A second substrate structure may be provided, the second substrate structure including a second substrate, a memory cell structure disposed on the second substrate, a second conductive connection structure electrically connected to the memory cell structure over the second substrate, and a second two-dimensional inorganic layer disposed adjacent to the second conductive connection structure and the second two-dimensional inorganic layer having negative charges. The first and second substrate structures may be joined to each other such that the first and second conductive connection structures are connected to each other and the first and second two-dimensional inorganic layers are joined to each other.

A semiconductor device according to another embodiment of the present disclosure may include a first substrate structure including a first substrate, a memory cell drive circuit disposed on the first substrate, a first conductive connection structure disposed over the first substrate and electrically connected to the memory drive circuit, and a first two-dimensional inorganic layer disposed adjacent to the first conductive connection structure and having negative charges. The semiconductor device may include a second substrate structure including a second substrate, a memory cell structures disposed on the second substrate, a second conductive connection structure disposed over the second substrate and electrically connected to the memory cell structures, and a second two-dimensional inorganic layer disposed adjacent to the second conductive connection structure and having negative charges. The semiconductor device may include a connection portion including a first joint portion in which the first and second conductive connection structures are joined to each other and a second joint portion in which the first and second two-dimensional inorganic layers are joined to each other.

There is disclosed a method of fabricating a semiconductor device according to an embodiment of the present disclosure. In the method, a first substrate structure may be provided, the first substrate structure including a first substrate body including a first via, a first wiring structure disposed on a surface of the first substrate body and connected to the first via, a connection pad disposed on the first wiring structure, a first conductive connection structure disposed on another surface of the substrate body and electrically connected to the first via, and a first two-dimensional inorganic layer disposed adjacent to the first conductive connection structure and the first two-dimensional inorganic layer having negative charges. A second substrate structure may be provided, the second substrate structure including a second substrate body including a second via, a second wiring structure disposed on a surface of the second substrate body and connected to the second via, a second conductive connection structure disposed on the second wiring structures, and a second two-dimensional inorganic layer disposed adjacent to the second conductive connection structure and the second two-dimensional inorganic layer having negative charges. The first and second substrate structures may be joined to each other such that the first and second conductive connection structures are connected to each other and the first and second two-dimensional inorganic layers are joined to each other.

A semiconductor device according to another embodiment of the present disclosure may include a first substrate structure including a first substrate body including a first via, a first wiring structure disposed on a surface of the first substrate body and connected to the first via, a connection pad disposed on the first wiring structure, a first conductive connection structure disposed on another surface of the first substrate body and electrically connected to the first via, and a first two-dimensional inorganic layer disposed adjacent to the first conductive connection structure and the first two-dimensional inorganic layer having negative charges. The semiconductor device may include a second substrate structure including a second substrate body including a second via, a second wiring structure disposed on a surface of the second substrate body and connected to the second via, a second conductive connection structure disposed on the second wiring structure, and a second two-dimensional inorganic layer disposed adjacent to the second conductive connection structure and the second two-dimensional inorganic layer having negative charges. The semiconductor device may include a connection portion including a first joint portion in which the first and second conductive connection structures are joined to each other and a second joint portion in which the first and second two-dimensional inorganic layers are joined to each other. These and other features and advantages of the present invention over the state of the art will become better understood by those of ordinary skill in this art from the following detailed description of specific embodiments in reference with the accompanying drawings.

DETAILED DESCRIPTION

Figure 1A:
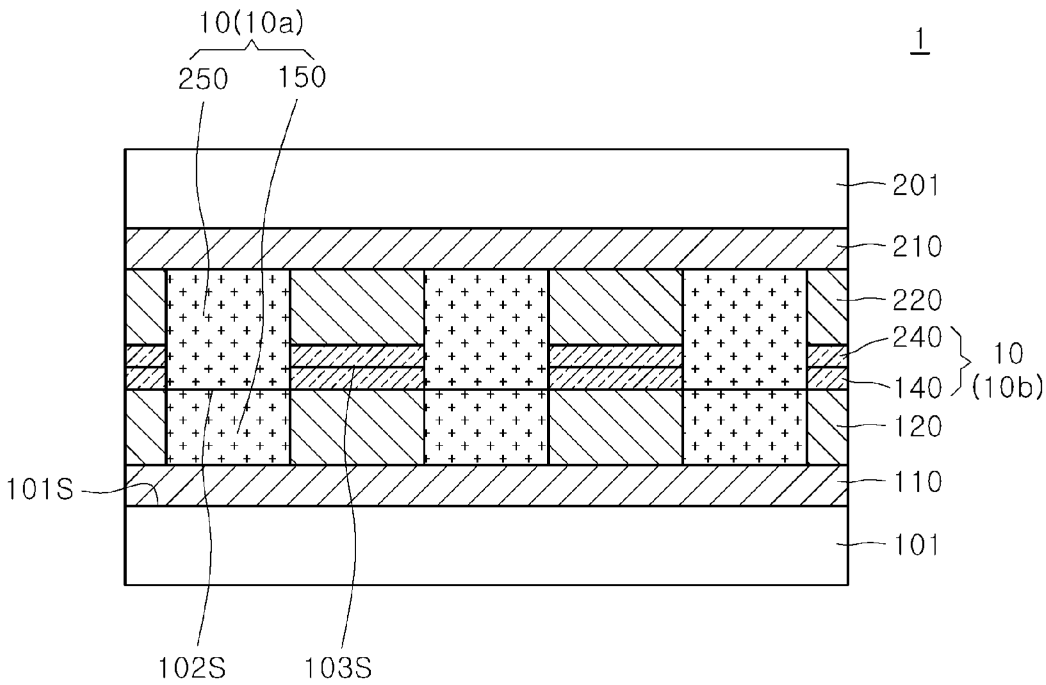
FIG. 1A is a cross-sectional view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms “comprise”, “include”, or “have” are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

A two-dimensional material may refer to a crystalline material in which atoms or molecules are formed substantially in a single monolayer. In the single monolayer of the two-dimensional material, the atoms or molecules may be coupled by an intramolecular force such as a covalent bond. The single monolayer may be coupled to another adjacent single monolayer by an intermolecular force such as a van der Waals force. Accordingly, a plurality of the two-dimensional material may be stacked by using the intermolecular force.

Figure 1B:
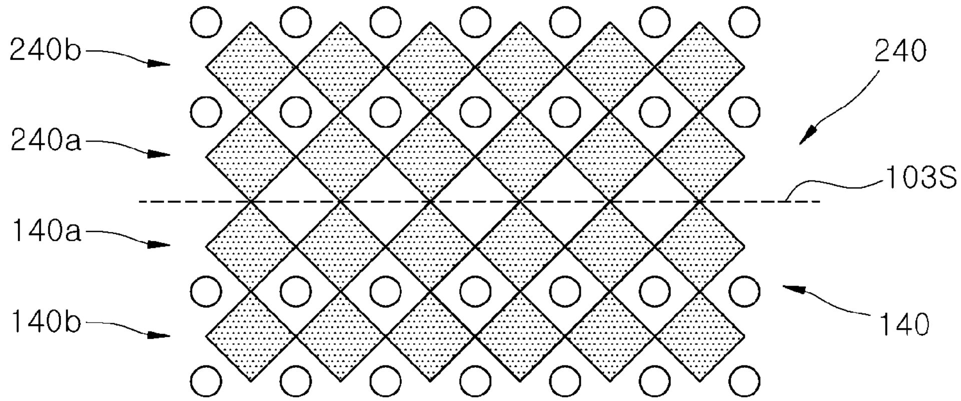
FIG. 1B is a cross-sectional view schematically illustrating a joint portion between two-dimensional inorganic layers of a semiconductor device according to an embodiment of the present disclosure.

FIG. 1A is a cross-sectional view schematically illustrating a semiconductor device generally designated with numeral 1 according to an embodiment of the present disclosure. FIG. 1B is a cross-sectional view schematically illustrating a joint portion 10 between two-dimensional inorganic layers of the semiconductor device 1 according to an embodiment of the present disclosure. Referring to FIG. 1A, the semiconductor device 1 may include a substrate body 101, first and second wirings 110 and 210 disposed to be spaced apart from each other in a direction substantially perpendicular to a surface 101S of the substrate body 101 over the substrate body 101, and connection portions 10 electrically connecting the first and second wirings 110 and 210 to each other over the substrate body 101. Each of the connection portions 10 may include first and second joint portions 10*a* and 10*b*. The first joint portion 10*a* may include a joint of first and second conductive connection structures 150 and 250. The second joint portion 10*b* may include a joint of first and second two-dimensional inorganic layers 140 and 240.

The substrate body 101 may include an integrated circuit. In an embodiment, the substrate body 101 may include a substrate, functional devices disposed on the substrate, connection layers electrically connecting the functional devices to each other, and interlayer insulation layers. The connection layer may include, for example, a circuit pattern layer, a contact plug, a contact via, a through silicon via (TSV), or the like. The interlayer insulation layers may electrically insulate the functional devices and the connection layers.

The first wiring 110 may be disposed on the substrate body 101. The first wiring 110 may include a conductive material. The conductive material may include metal, metal nitride, or the like. The first wiring 110 may be disposed in a shape of a line pattern on the substrate body 101. The first wiring 110 may electrically connect the first conductive connection structure 150 to the integrated circuit of the substrate body 101.

The first conductive connection structures 150 may be disposed to be electrically connected to the first wiring 110 over the substrate body 101. Each of the first conductive connection structures 150 may be a metal pattern structure, for example. The metal pattern structure may include, for example, a metal pillar or a metal pad. The metal may include copper (Cu), for example.

A first passivation layer 120 may be disposed adjacent to the first conductive connection structures 150 over the substrate body 101. The first passivation layer 120 may include, for example, oxide, nitride, oxynitride, or a combination of two or more thereof. Referring to FIG. 1A, the first passivation layer 120 may be disposed to contact side surfaces of the first conductive connection structures 150. The first passivation layer 120 may be disposed to fill spaces between the first conductive connection structures 150.

The first two-dimensional inorganic layer 140 may be disposed on the first passivation layer 120. The first two-dimensional inorganic layer 140 may include an insulating two-dimensional material. The two-dimensional material may be an inorganic material.

In an embodiment, the first two-dimensional inorganic layer 140 may include at least one layer of the two-dimensional material. A thickness of the first two-dimensional inorganic layer 140 may be proportional to the number of layers of the two-dimensional material. The two-dimensional material refers to a crystalline material in which atoms or molecules are formed substantially in a single monolayer. Accordingly, the first two-dimensional inorganic layer 140 on which the two-dimensional materials are stacked may have a flat surface while having a sufficiently low surface roughness.

The first two-dimensional inorganic layer 140 may include, for example, titanium oxide, titanium cobalt oxide, titanium iron oxide, manganese oxide, niobium oxide, titanium niobium oxide, tantalum oxide, lanthanum titanium oxide, praseodymium titanium oxide, samarium titanium oxide, neodymium titanium oxide, europium titanium oxide, gadolinium titanium oxide, dysprosium titanium oxide, bismuth titanium oxide, lanthanum niobium oxide, strontium tantalum oxide, calcium niobium oxide, strontium niobium oxide, tungsten oxide, or a combination of two or more thereof.

Referring to FIG. 1A, the first conductive connection structures 150 may be joined to the second conductive connection structures 250 over the substrate body 101 to constitute first joint portions 10*a*. The second conductive connection structures 250 may be respectively disposed on the first conductive connection structures 150.

The second conductive connection structures 250 may be directly joined to the first conductive connection structures 150. The second conductive connection structures 250 may be disposed to be overlapped or aligned with the first conductive connection structures 150 in a z-direction. In an embodiment, a joint surface 102S between the first and second conductive connection structures 150 and 250 may be parallel to the surface 101S of the substrate body 101. A configuration of the second conductive connection structure 250 may be substantially the same as a configuration of the first conductive connection structure 150.

Referring to FIG. 1A, the second two-dimensional inorganic layer 240 may be joined with the first two-dimensional inorganic layer 140 over the substrate body 101 to constitute the second joint portion 10*b*. The second two-dimensional inorganic layer 240 may be disposed on the first two-dimensional inorganic layer 140. A configuration of the second two-dimensional inorganic layer 240 may be substantially the same as a configuration of the first two-dimensional inorganic layer 140.

The second two-dimensional inorganic layer 240 may be directly joined with the first two-dimensional inorganic layer 140. The first and second two-dimensional inorganic layers 140 and 240 may be disposed to be overlapped or aligned with each other in the z-direction. In an embodiment, a joint surface 103S of the first and second two-dimensional inorganic layers 140 and 240 may be parallel to the surface 101S of the substrate body 101. The second two-dimensional inorganic layer 240 may be joined with the first two-dimensional inorganic layer 140 to constitute the second joint portion 10*b*.

Referring to FIG. 1B, the first two-dimensional inorganic layer 140 may include multi-layered insulating two-dimensional materials 140*a* and 140*b*. The two-dimensional materials 140*a* and 140*b* may be joined to each other by van der Waals forces. Similarly, the second two-dimensional inorganic layer 240 may include multi-layered insulating two-dimensional materials 240*a* and 240*b*. The two-dimensional materials 240*a* and 240*b* may be joined to each other by van der Waals forces. On the other hand, the first and second two-dimensional inorganic layers 140 and 240 may form a covalent bond at the joint surface 103S of the first and second two-dimensional inorganic layers 140 and 240.

Referring to FIG. 1A again, a second wiring 210 may be disposed on the second conductive connection structure 250 and the second passivation layer 220. The second wiring 210 may include a conductive material. The conductive material may include metal, metal nitride, or the like. The second wiring 210 may be disposed in a shape of a line pattern.

A semiconductor structure 201 may be disposed on the second wiring 210. In an embodiment, the semiconductor structure 201 may include an integrated circuit. That is, the semiconductor structure 201 may include functional devices, connection layers electrically connecting the functional devices to each other, and interlayer insulation layers. The functional devices may include, for example, transistors, capacitors, or the like. In another embodiment, the semiconductor structure 201 may include a plurality of wirings and interlayer insulation layers electrically insulating the plurality of wirings. In yet another embodiment, the semiconductor structure 201 may include a support structure. The support structure may include an insulator. The second wiring 210 may electrically connect the second conductive connection structure 250 to the integrated circuit of the semiconductor structure 201.

As described above, the semiconductor device 1 according to an embodiment of the present disclosure may include the connection portion 10 including first and second joint portions 10*a* and 10*b*. In the first joint portion 10*a*, the first and second conductive connection structures 150 and 250 may be overlapped or aligned with each other in a direction substantially perpendicular to the surface of the substrate body 101. In the second joint portion 10*b*, the first and second two-dimensional inorganic layers 140 and 240 may be overlapped or aligned with each other in a direction substantially perpendicular to the surface of the substrate body 101.

Figure 2A:
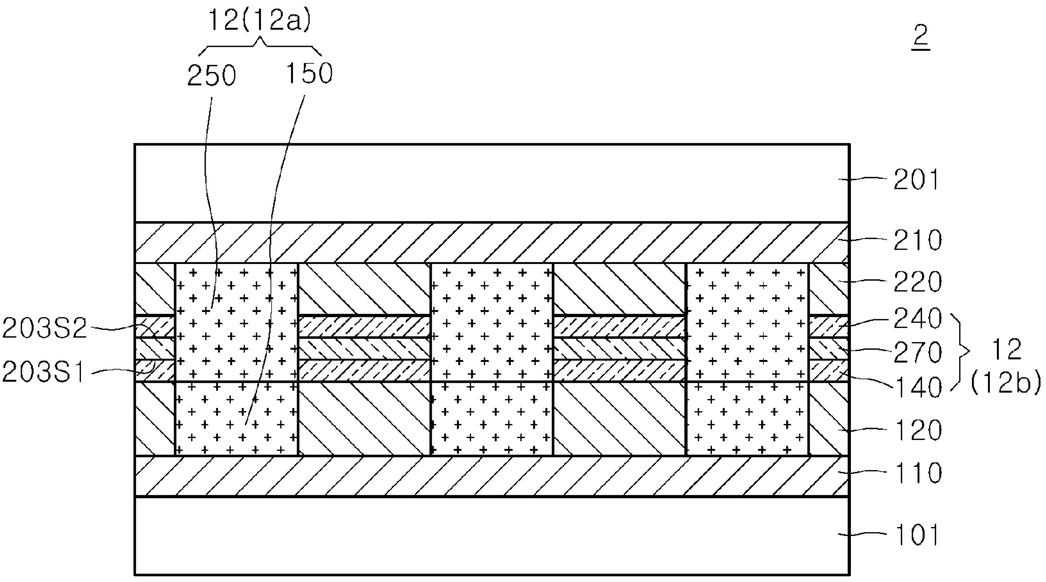
FIG. 2A is a cross-sectional view schematically illustrating a semiconductor device according to another embodiment of the present disclosure.
Figure 2B:
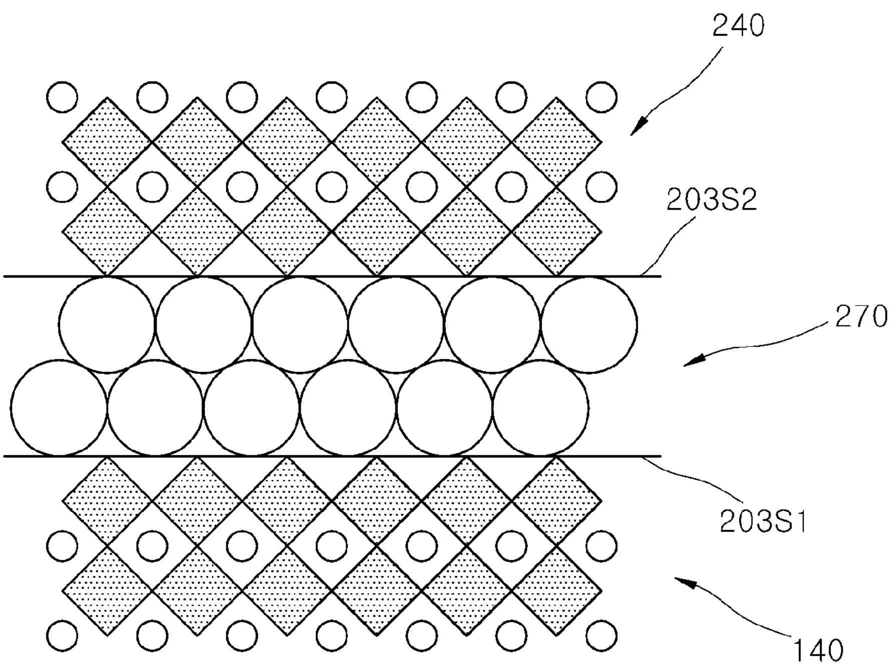
FIG. 2B is a cross-sectional view schematically illustrating a joint portion between two-dimensional inorganic layers of a semiconductor device according to another embodiment of the present disclosure.

FIG. 2A is a cross-sectional view schematically illustrating a semiconductor device 2 according to another embodiment of the present disclosure. FIG. 2B is a cross-sectional view schematically illustrating a joint portion between two-dimensional inorganic layers of the semiconductor device 2 according to another embodiment of the present disclosure.

Referring to FIGS. 2A and 2B, the semiconductor device 2 may further include an inorganic joint layer 270 disposed between the first and second two-dimensional inorganic layers 140 and 240, compared to the semiconductor device 1 of FIGS. 1A and 1B. A configuration of the rest of the semiconductor device 2 except for the inorganic joint layer 270 may be substantially the same as that of the semiconductor device 1 of FIGS. 1A and 1B. The inorganic joint layer 270 may include, for example, aluminum oxide, magnesium aluminum oxide, magnesium cobalt oxide, magnesium iron oxide, cobalt aluminum oxide, cobalt oxide, cobalt iron oxide, nickel aluminum oxide, nickel cobalt oxide, nickel iron oxide, zinc aluminum oxide, zinc cobalt oxide, zinc iron oxide, neodymium oxide, samarium oxide, europium oxide, gadolinium oxide, terbium oxide, dysprosium oxide, holmium oxide, erbium oxide, or a combination of two or more thereof.

Referring to FIG. 2A, the semiconductor device 2 may include connection portions 12 electrically connecting the first and second wirings 110 and 210 to each other. Each of the connection portions 12 may include first and second joint portions 12*a* and 12*b*. The first joint portion 12*a* may include first and second conductive connection structures 150 and 250. The first joint portion 12*a* may be substantially the same as the first joint portion 10*a* of the semiconductor device 1 described in connection with FIGS. 1A and 1B. The second joint portion 12*b* may include a joint of the first two-dimensional material layer 140 and the inorganic joint layer 270 and a joint of the inorganic joint layer 270 and the second two-dimensional inorganic layer 240.

Referring to FIGS. 2A and 2B, in the second joint portion 12*b*, the first two-dimensional inorganic layer 140 and the inorganic joint layer 270 may form a first joint surface 203S1, and the inorganic joint layer 270 and the second two-dimensional inorganic layer 240 may form a second joint surface 203S2. In an embodiment, on the first joint surface 203S1, the first two-dimensional inorganic layer 140 and the inorganic joint layer 270 may form a covalent bond. In addition, on the second joint surface 203S2, the inorganic joint layer 270 and the second two-dimensional inorganic layer 240 may form a covalent bond.

FIGS. 3 to 10, 11A, 11B, and 12 are cross-sectional views schematically illustrating a method of fabricating a semiconductor device according to an embodiment of the present disclosure. The fabricating method may be applied to a method of fabricating the semiconductor device 1 described above with reference to FIGS. 1A and 1B.

Figure 3:
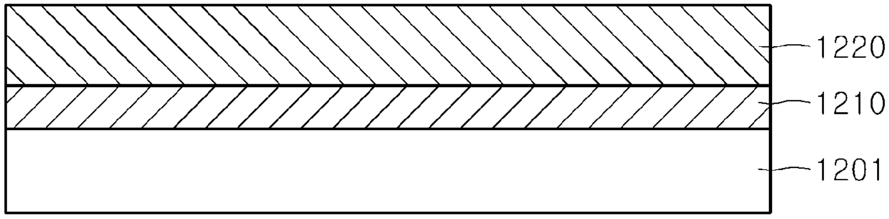
FIGS. 3 to 10, 11A, 11B, and 12 are cross-sectional views schematically illustrating a method of fabricating a semiconductor device according to an embodiment of the present disclosure.
Figure 3:
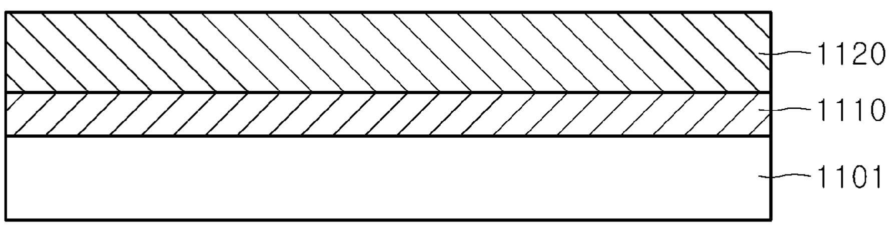

Referring to FIG. 3, first and second substrate bodies 1101 and 1201 may be provided. Each of the first and second substrate bodies 1101 and 1201 may include integrated circuits. In an embodiment, each of the first and second substrate bodies 1101 and 1201 may include a substrate, functional devices disposed on the substrate, connection layers electrically connecting the functional devices to each other, and interlayer insulation layers. The functional devices may include, for example, a transistor, a capacitor, or the like. The connection layers may include, for example, a circuit pattern layer, a contact plug, a contact via, a through silicon via (TSV), or the like. The interlayer insulation layers may electrically insulate the functional devices and the connection layers.

Next, a first wiring 1110 may be formed on the first substrate body 1101, and a second wiring 1210 may be formed on the second substrate body 1201. Each of the first and second wirings 1110 and 1210 may include a conductive material. The conductive material may include metal, metal nitride, or the like. Each of the first and second wirings 1110 and 1210 may be formed in a shape of a line pattern on the first and second substrate bodies 1101 and 1201, respectively. The first and second wirings 1110 and 1210 may be formed, for example, by using a chemical vapor deposition method, an atomic layer deposition method, or the like.

Next, a first passivation layer 1120 covering the first wiring 1110 may be formed over the first substrate body 1101. A second passivation layer 1220 covering the second wiring 1210 may be formed over the second substrate body 1201. Each of the first and second passivation layers 1120 and 1220 may include an insulating material. The insulating material may include, for example, oxide, nitride, oxynitride, or a combination of two or more thereof. Each of the first and second passivation layers 1120 and 1220 may be formed by using a chemical vapor deposition method, an atomic layer deposition method, a coating method, or the like.

Figure 4:
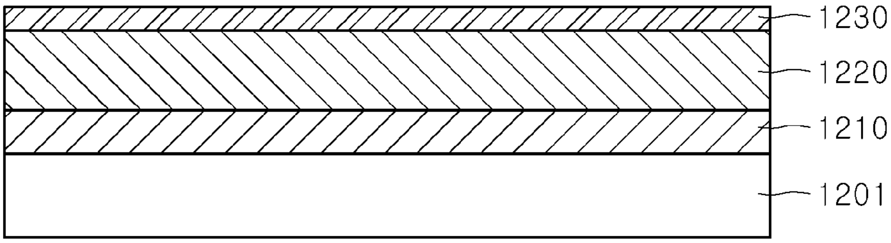
Figure 4:
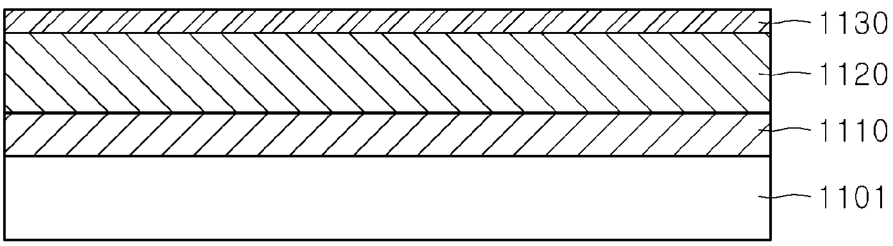

Referring to FIG. 4, an organic material 1130 having positive charges may be applied on the first passivation layer 1120. In addition, an organic material 1230 having positive charges may be applied on the second passivation layer 1220. In an embodiment, applying the organic materials 1130 and 1230 having positive charges may be performed as follows. First, the organic materials 1130 and 1230 having positive charges may be synthesized, and each of the synthesized organic materials may be dispersed in a solvent. Next, the solvent may be provided to the first and second substrate bodies 1101 and 1201 on which the first and second wirings 1110 and 1210 and the first and second passivation layers 1120 and 1220 of FIG. 3 are formed, respectively. Specifically, as a process of providing the solvent, a method of immersing the first and second substrate bodies 1101 and 1201 in the solvent may be applied. As a result, thin films of the organic materials 1130 and 1230 may be formed on the first and second passivation layers 1120 and 1220, respectively.

Each of the organic materials 1130 and 1230 having positive charges may include poly(acrylic acid) (PAA), poly(allylamine hydrochloride) (PAH), poly(anilinepropanesulfonic acid) (PAPSA), poly(dimethyl-diallylammonium chloride) (PDDA), poly(ethyleneimine) (PEI), poly(L-lysin)), poly(methacrylic acid) (PMA), poly(styrenesulfonate) (PSS), poly(vinylsulfonate) (PVS), poly-L-arginine (PLAr), poly-L-histidine (PLH), or a combination of two or more thereof.

Figure 5:
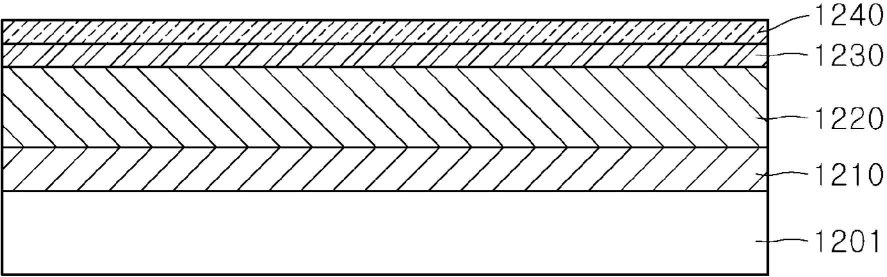
Figure 5:
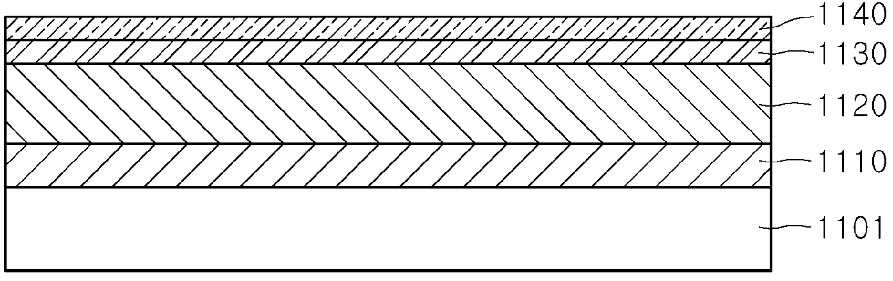

Referring to FIG. 5, a two-dimensional inorganic sheet 1140 having negative charges may be applied on the organic material 1130 having positive charges. In addition, a two-dimensional inorganic material sheet 1240 having negative charges may be applied on the organic material 1230 having positive charges. Each of the two-dimensional inorganic sheets 1140 and 1240 may include an insulating two-dimensional material. The two-dimensional material may be an inorganic material. In an embodiment, each of the two-dimensional inorganic sheets 1140 and 1240 may include at least one layer of the insulating two-dimensional material.

In an embodiment, applying the two-dimensional inorganic sheets 1140 and 1240 may be performed as follows. Each of the two-dimensional inorganic sheets 1140 and 1240 having negative charges may be provided in a liquid colloid state, and the liquid colloid may be provided to the first and second substrate bodies 1101 and 1201 on which the organic materials 1130 and 1230 having positive charges of FIG. 4 are formed, respectively. Specifically, a method of immersing the first and second substrate bodies 1101 and 1201 in the liquid colloid may be applied.

In this case, the two-dimensional inorganic sheets 1140 and 1240 having negative charges may be joined to the organic material 1130 and 1230 having positive charges, respectively, by electrostatic attraction. A thickness of each of the two-dimensional inorganic material sheets 1140 and 1240 having the negative charges may be determined according to the number of layers of the insulating two-dimensional material stacked on the organic materials 1130 and 1230 having positive charges.

Each of the two-dimensional inorganic sheets 1140 and 1240 having negative charges may include $Ti_{0.91}O_2^{0.36-}$, $Ti_{0.87}O_2^{0.52-}$, $Ti_{0.8}Co_{0.2}O_2^{0.4-}$, $Ti_{0.6}Fe_{0.4}O_2^{0.4-}$, $MnO_2^{0.4-}$, $Nb_6O_{17}^{0.4-}$, $Nb_3O_8^-$, $TiNbO_5^-$, $Ti_5NbO_{14}^{3-}$, $TaO_3^-$, $RE_2Ti_3O_{10}^{2-}$ (RE is one of La, Pr, Sm, Nd, Eu, Gd, and Dy), $Bi_4Ti_3O_{12}^{2-}$, $LaNb_2O_7^-$, $SrTa_2O_7^{2-}$, $Ca_2Nb_3O_{10}^-$, $Sr_2Nb_3O_{10}^-$, $W_2O_7^{2-}$, or a combination of two or more thereof.

Figure 6:
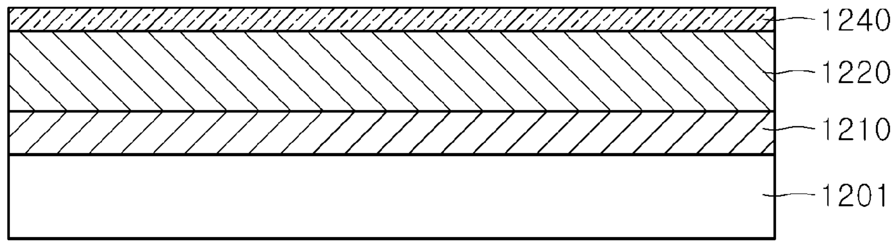
Figure 6:
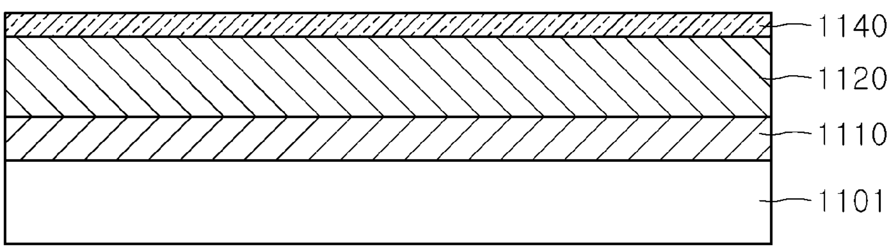

Referring to FIG. 6, at least one of ultraviolet (UV) treatment and heat treatment may be performed on the first and second substrate bodies 1101 and 1201 of FIG. 5 to remove the organic materials 1130 and 1230 having positive charges. As a result, the two-dimensional inorganic sheets 1140 and 1240 having negative charges may be joined to the first and second passivation layers 1120 and 1220, respectively. Hereinafter, the two-dimensional inorganic material sheet 1140 having negative charges formed on the first passivation layer 1120 may be referred to as a "first two-dimensional inorganic layer 1140". The two-dimensional inorganic material sheet 1240 having negative charges formed on the second passivation layer 1220 may be referred to as a "second two-dimensional inorganic layer 1240".

Figure 7:
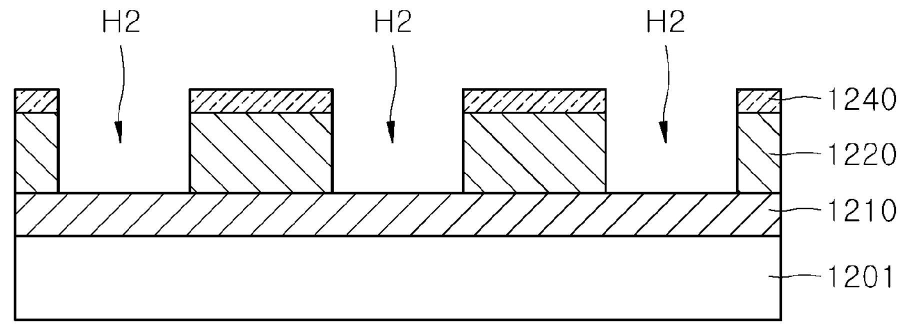
Figure 7:
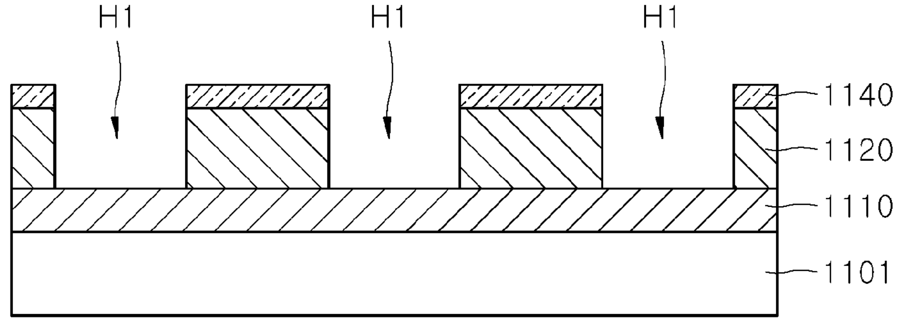

Referring to FIG. 7, first hole patterns H1 may be formed to penetrate the first two-dimensional inorganic layer 1140 and the first passivation layer 1120 over the first substrate body 1101. The first hole patterns H1 may expose the first wiring 1110. In addition, second hole patterns H2 may be formed to penetrate the second two-dimensional inorganic layer 1240 and the second passivation layer 1220 over the second substrate body 1201. The second hole patterns H2 may expose the second wiring 1210.

Figure 8:
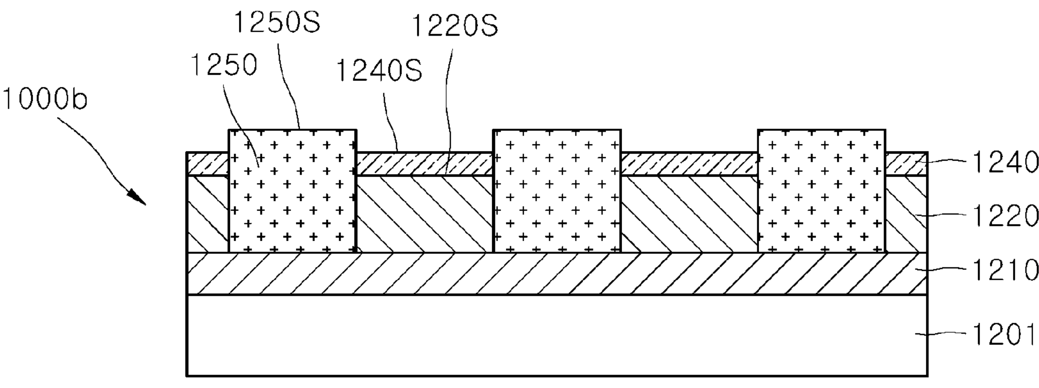
Figure 8:
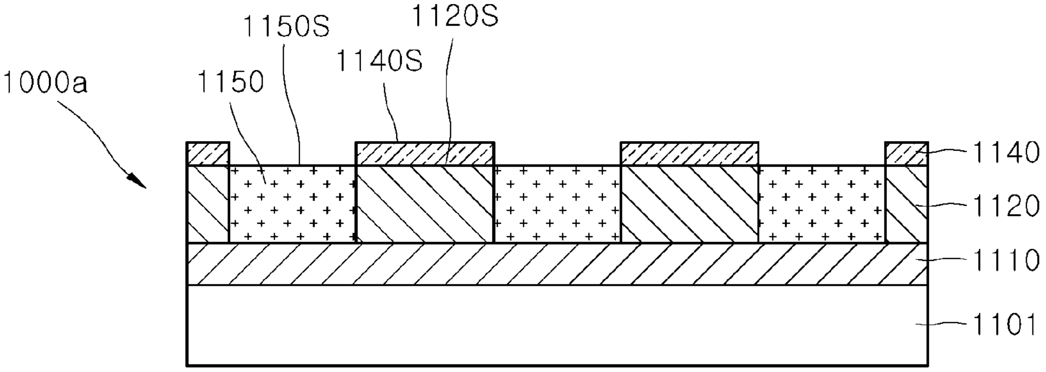

Referring to FIG. 8, the first hole patterns H1 may be filled with a conductive material to form first conductive connection structures 1150. Each of the first conductive connection structures 1150 may be a metal pattern structure, for example. The metal pattern structure may include, for example, a metal pillar or a metal pad. The metal may include, for example, copper (Cu).

In an embodiment, the first conductive connection structures 1150 may be formed as follows. A metal layer may be formed on a resultant structure of FIG. 7 in which the first hole patterns H1 are formed. The metal layer may be formed to fill the first hole patterns H1 and have a predetermined thickness on the first two-dimensional inorganic layer 1140 formed outside the first hole patterns H1. The metal layer may be formed by using, for example, a chemical vapor deposition method, a sputtering method, or a plating method. The plating method may include, for example, electrolytic plating, electroless plating, or a combination thereof. Next, a planarization process may be performed on the metal layer to expose the first and second two-dimensional inorganic layers 1140 and 1240 and to form a metal structure in the first hole patterns H1 only. In this case, by controlling the planarization process, the first conductive connection structures 1150 may be formed such that an uppermost surface (i.e., a top surface) 1150S of each of the first conductive connection structures 1150 is located at a lower level than an uppermost surface 1140S of the first two-dimensional inorganic layer 1140. As a result, the first substrate structure 1000*a* illustrated in FIG. 8 may be formed.

According to an embodiment of the present disclosure, the first two-dimensional inorganic layer 1140 may be formed of at least one layer of the two-dimensional material. The two-dimensional material refers to a crystalline material in which atoms or molecules are formed substantially in a single monolayer. Accordingly, the two-dimensional material may have sufficiently low surface roughness and a flat surface. Accordingly, when the planarization process is performed on the metal layer formed on the first two-dimensional inorganic layer 1140 on which the two-dimensional material is stacked, the first conductive connection structure 1150 having a uniform surface roughness and height may be formed. That is, the planarization process may be affected by the surface roughness of the first two-dimensional inorganic layer 1140.

The second hole patterns H2 may be filled with a conductive material to form the second conductive connection structures 1250. The second conductive connection structures 1250 may be, for example, metal pattern structures. The metal pattern structures may include, for example, a metal pillar or a metal pad. The metal may include, for example, copper (Cu).

In an embodiment, a method of forming the second conductive connection structures 1250 may be substantially the same as the method of forming the first conductive connection structures 1150. In this case, by controlling the planarization process, the second conductive connection structure 1250 may be formed such that an uppermost surface 1250S of each of the second conductive connection structures 1250 is located at a higher level than an uppermost surface 1240S of the first two-dimensional inorganic layer 1240. As a result, the second substrate structure 1000*b* illustrated in FIG. 8 may be formed.

Figure 9:
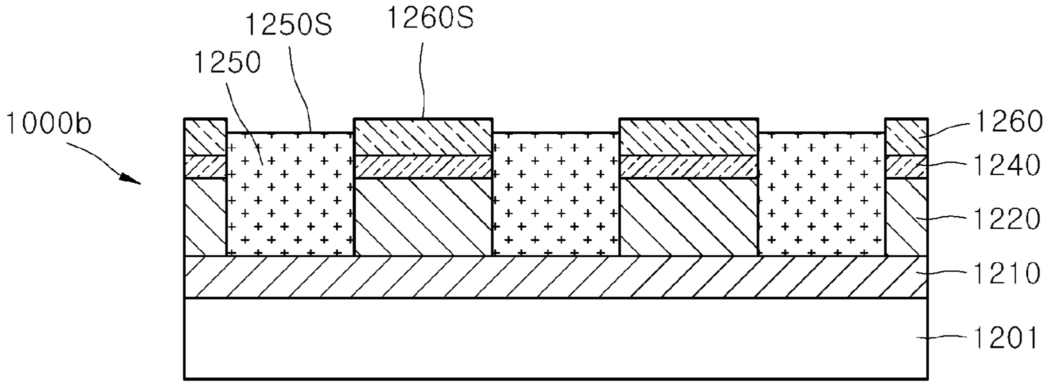
Figure 9:
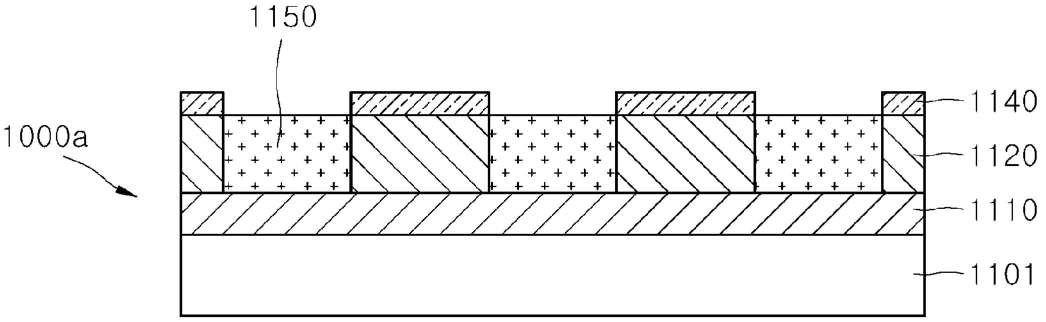

Referring to FIG. 9, an organic material 1260 having positive charges may be applied on the second two-dimensional inorganic layer 1240 of the second substrate structure 1000*b*. The organic material 1260 having positive charges might not be applied on the second conductive connection structures 1250, but be applied only on the second two-dimensional inorganic layer 1240 having negative charges. That is, the organic material 1260 may be applied on the second two-dimensional inorganic layer 1240 by electrostatic attraction. In this case, an uppermost surface 1260S of the applied organic material 1260 may be positioned at a higher level than an uppermost surface 1250S of the second conductive connection structure 1250.

In an embodiment, a method of applying the organic material 1260 having positive charges may be substantially the same as the method of applying the organic material 1230 having positive charges on the second passivation layer 1220, described above with reference to FIG. 4.

Figure 10:
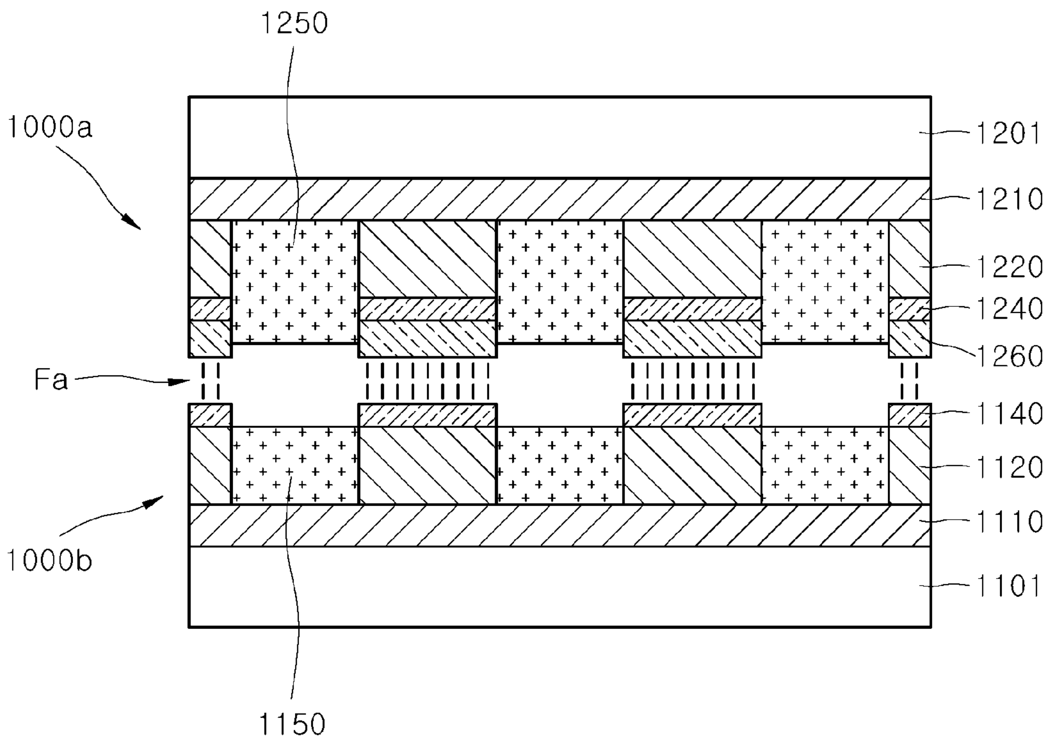

Referring to FIG. 10, the first and second substrate structures 1000*a* and 1000*b* may be disposed adjacent to each other so that the organic material 1260 having positive charges and the first two-dimensional inorganic layer 1140 face each other. In this case, the first two-dimensional inorganic layer 1140 and the second two-dimensional inorganic layer 1240 may be aligned with each other by using the organic material 1260 having positive charges. The organic material 1260 having positive charges disposed on the second two-dimensional inorganic layer 1240 may be self-aligned with the first two-dimensional inorganic layer 1140 having negative charges by electrostatic attraction Fa. As the first and second two-dimensional inorganic layers 1140 and 1240 are aligned with each other, the first and second conductive connection structures 1150 and 1250 may also be aligned with each other.

Figure 11A:
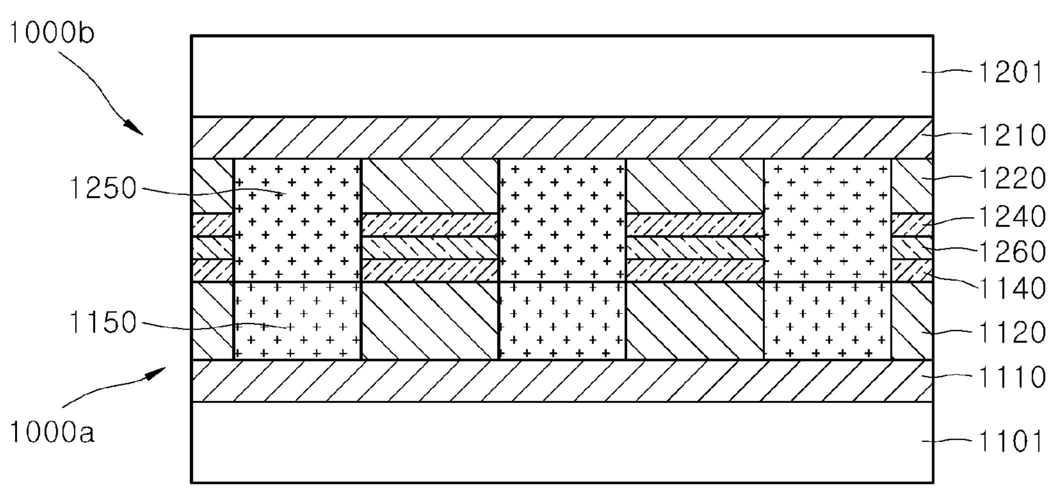

Referring to FIG. 11A, the first substrate structure 1000*a* and the second substrate structure 1000*b* may be physically brought into contact with each other in a state where the first two-dimensional inorganic layer 1140 and the second two-dimensional inorganic layer 1240 are aligned with each other. Accordingly, the first and second conductive connection structures 1150 and 1250 may be disposed to overlap with each other. The first and second two-dimensional inorganic layers 1140 and 1240 may be disposed to overlap with each other, with the organic material 1260 having positive charges therebetween.

Figure 11B:
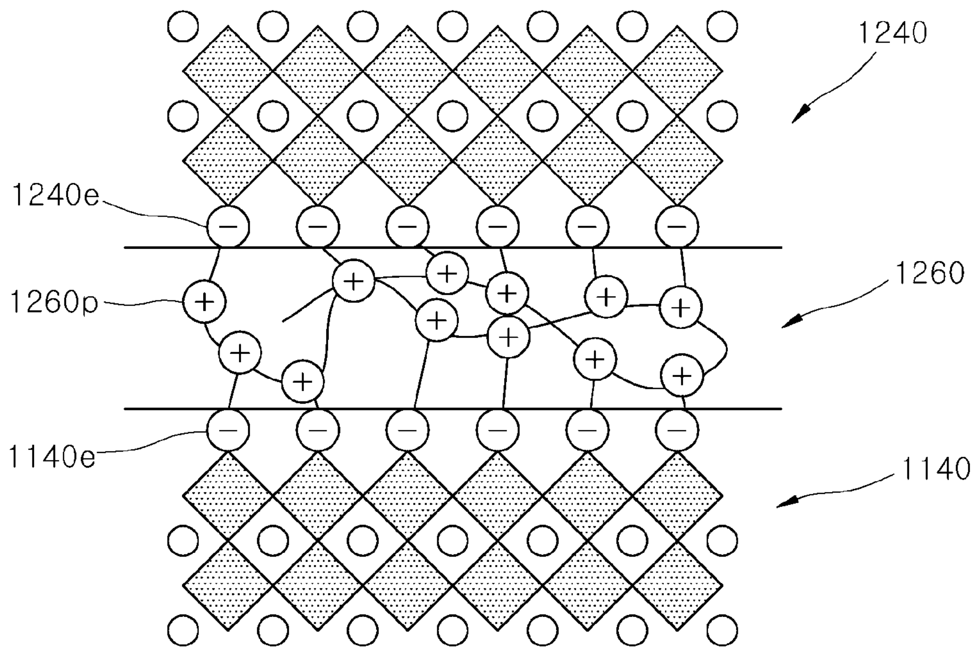

FIG. 11B is a cross-sectional view schematically illustrating a joint portion between the two-dimensional inorganic layers of the semiconductor device according to an embodiment of the present disclosure. FIG. 11B is a cross-sectional view of the semiconductor device of FIG. 11A. Referring to FIG. 11B, the first two-dimensional inorganic layer 1140 and the organic material 1260 may be coupled by electrostatic attraction between negative charges 1140*e* and positive charges 1260*p*, and the second two-dimensional inorganic layer 1240 and the organic material 1260 may be coupled by electrostatic attraction between the negative charges 1240*e* and the positive charges 1260*p*.

Figure 12:
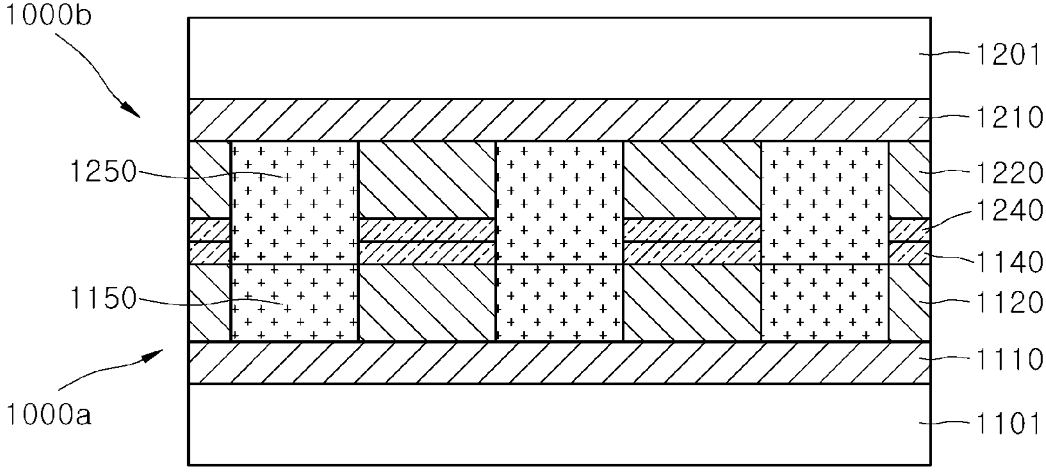

Referring to FIG. 12, in a state in which the first and second substrate structures 1000*a* and 1000*b* are in contact, at least one of UV treatment and heat treatment may be performed to remove the organic material 1260. As the organic material 1260 is removed, the first and second two-dimensional inorganic layers 1140 and 1240 may be directly joined to each other to form an insulating joint. Similarly, the first and second conductive connection structures 1150 and 1250 may be directly joined to each other to form a conductive joint. When at least one of the UV treatment and heat treatment is performed, volumes of the first and second conductive connection structures 1150 and 1250 may expand.

As a result of the UV treatment or heat treatment, in a state in which alignment between the first and second two-dimensional inorganic layers 1140 and 1240 and alignment between the first and second conductive connection structures 1150 and 1250 are made, the semiconductor device in which the first and second substrate structures 1000*a* and 1000*b* are joined to each other may be fabricated.

In some embodiments, a process of applying the organic material 1260 having positive charges of FIG. 9 may be performed on the first two-dimensional inorganic layer 1140 of the first substrate structure 1000*a*, instead of the second two-dimensional inorganic layer 1240 of the second substrate structure 1000*b*. Then, the process of FIGS. 10 to 12 may be performed to fabricate the semiconductor device in which the first and second substrate structures 1000*a* and 1000*b* are joined.

Figure 13:
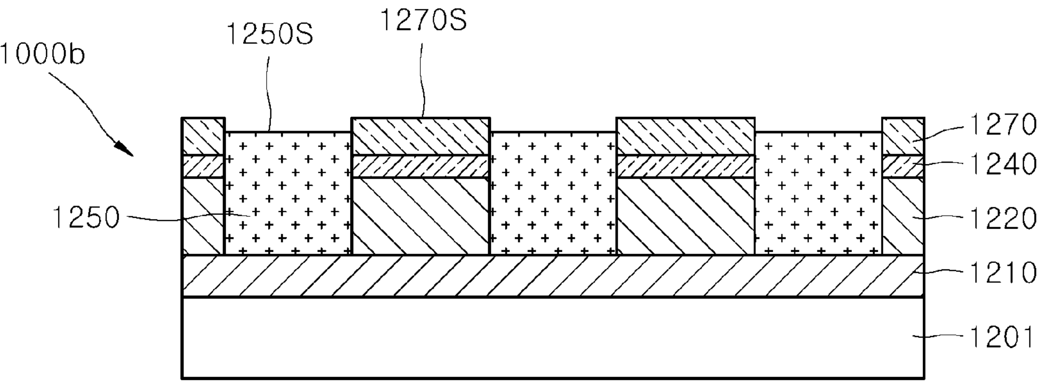
FIGS. 13 to 15 are cross-sectional views schematically illustrating a method of fabricating a semiconductor device according to another embodiment of the present disclosure.
Figure 13:
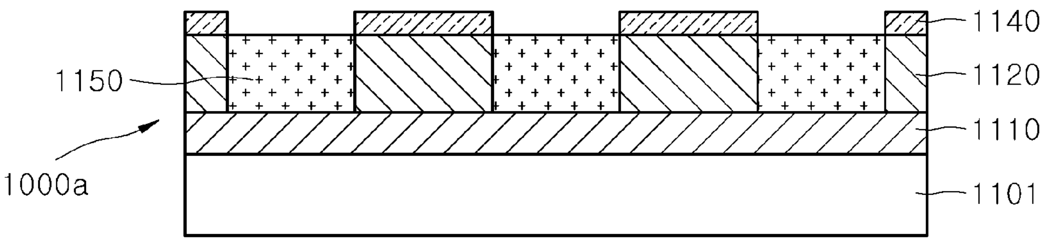
Figure 14:
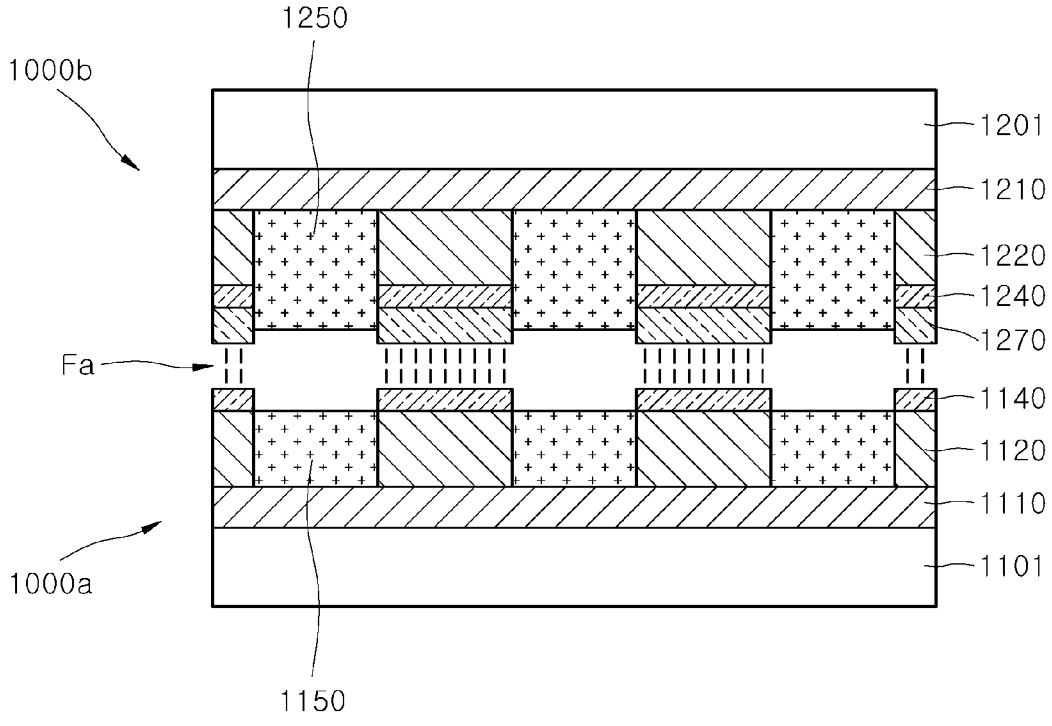
Figure 15:
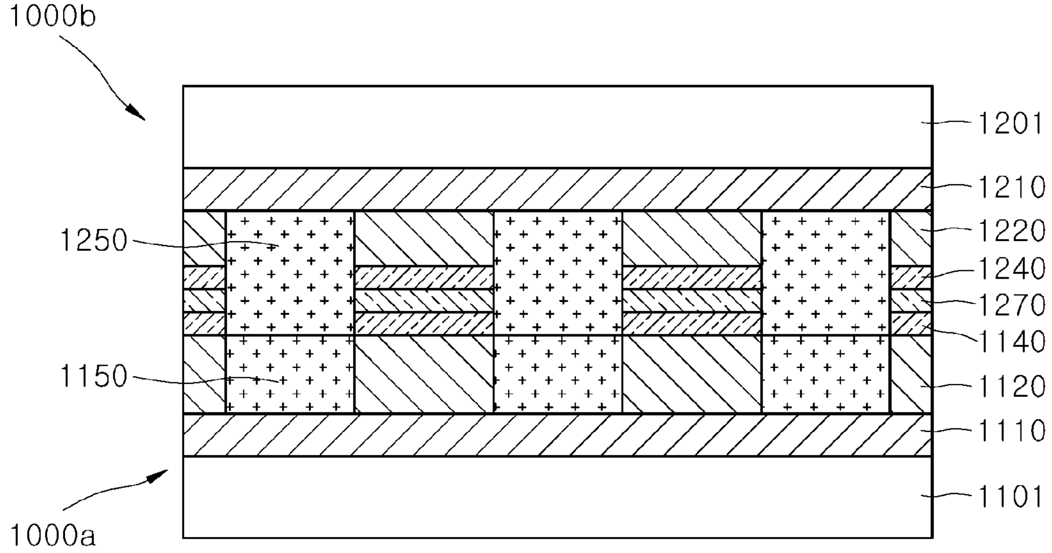

FIGS. 13 to 15 are cross-sectional views schematically illustrating a method of fabricating a semiconductor device according to another embodiment of the present disclosure. The method may be applied to fabricate the semiconductor device 2 described above with reference to FIGS. 2A and 2B.

Referring to FIG. 13, the processes described with reference to FIGS. 3 to 8 may be performed. Accordingly, the first and second substrate structures 1000*a* and 1000*b* of FIG. 8 may be formed.

Then, an inorganic material 1270 having positive charges may be applied on a second two-dimensional inorganic layer 1240 of the second substrate structure 1000*b*. The inorganic material 1270 having positive charges might not be applied on the second conductive connection structure 1250, but may be applied only on the second two-dimensional inorganic layer 1240 having negative charges. That is, the inorganic material 1270 may be applied on the second two-dimensional inorganic layer 1240 by electrostatic attraction. In this case, an uppermost surface 1270S of the applied inorganic material 1270 may be located at a higher level than an uppermost surface 1250S of the second conductive connection structure 1250.

In an embodiment, the inorganic material having positive charges may include at least one selected from the group consisting of, for example, $AlO_4Al_{12}(OH)_{24}H_2O_{12}^{7+}$, $Al_2O_8Al_{28}(OH)_{56}(H_2O)_{26}^{18+}$, $A_{1-x}B_x(OH)_2^{x+}$ ($0<x<1$) (A is $Mg^{2+}$, $Co^{2+}$, $Ni^{2+}$, $Zn^{2+}$B:$Al^{3+}$, $Co^{3+}$, or $Fe^{3+}$), and $RE(OH)_{2.5}(H_2O)^{0.5+}$ (RE is $Nd^{3+}$, $Sm^{3+}$, $Eu^{3+}$, $Gd^{3+}$, $Tb^{3+}$, $Dy^{3+}$, $Ho^{3+}$, or $Er^{3+}$).

In an embodiment, in the method of applying the inorganic material 1270 having positive charges, the inorganic material having positive charges may be provided, and then, the provided inorganic material may be provided on the second two-dimensional inorganic layer 1240 having negative charges by a coating method, an immersion method, or the like.

Referring to FIG. 14, the first and second substrate structures 1000*a* and 1000*b* may be disposed adjacent to each other so that the inorganic material 1270 having positive charges and the first two-dimensional inorganic layer 1140 face each other. In this case, the first two-dimensional inorganic layer 1140 and the second two-dimensional inorganic layer 1240 may be aligned with each other by electrostatic attraction Fa by using the inorganic material 1270 having positive charges. As the first two-dimensional inorganic layer 1140 and the second two-dimensional inorganic layer 1240 are aligned with each other, the first and second conductive connection structures 1150 and 1250 may be aligned with each other.

Referring to FIG. 15, in a state in which the first two-dimensional inorganic layer 1140 and the second two-dimensional inorganic layer 1240 are aligned with each other, the first substrate structure 1000*a* and the second substrate structure 1000*b* may physically contact each other.

Next, at least one of UV treatment and heat treatment may be performed in a state in which the first and second substrate structures 1000*a* and 1000*b* are in contact. In this case, after at least one of the UV treatment and the heat treatment is performed, the inorganic material 1270 having positive charges may remain. Accordingly, an insulating joint portion in which the first two-dimensional inorganic layer 1140, the inorganic material 1270, and the second two-dimensional inorganic layer 1240 are sequentially stacked may be formed. The first and second conductive connection structures 1150 and 1250 may also be joined to each other to form a conductive joint portion. The volume of the first and second conductive connection structures 1150 and 1250 may expand by at least one of the UV treatment and heat treatment.

As a result of the UV treatment or heat treatment, in a state in which alignment between the first and second two-dimensional inorganic layers 1140 and 1240 and alignment between the first and second conductive connection structures 1150 and 1250 are made, a semiconductor device in which the first and second substrate structures 1000*a* and 1000*b* are joined may be fabricated.

In some embodiments, in the process of applying the inorganic material 1270 having positive charges in FIG. 13, the first two-dimensional inorganic layer 1140 of the first substrate structure 1000*a* may be processed, instead of the second two-dimensional inorganic layer 1240 of the second substrate structure 1000*b*. Then, by performing the processes of FIGS. 14 and 15, the semiconductor device in which the first and second substrate structures 1000*a* and 1000*b* are joined may be fabricated.

Figure 16:
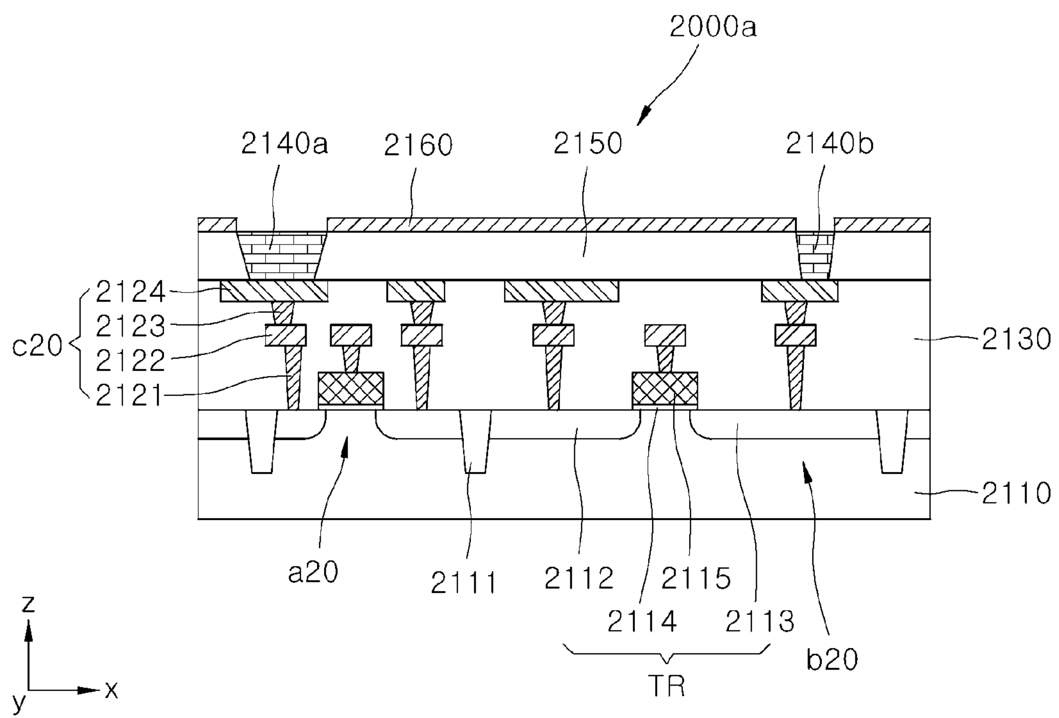
FIGS. 16 to 18 are cross-sectional views schematically illustrating a method of fabricating a semiconductor device according to another embodiment of the present disclosure.
Figure 17:
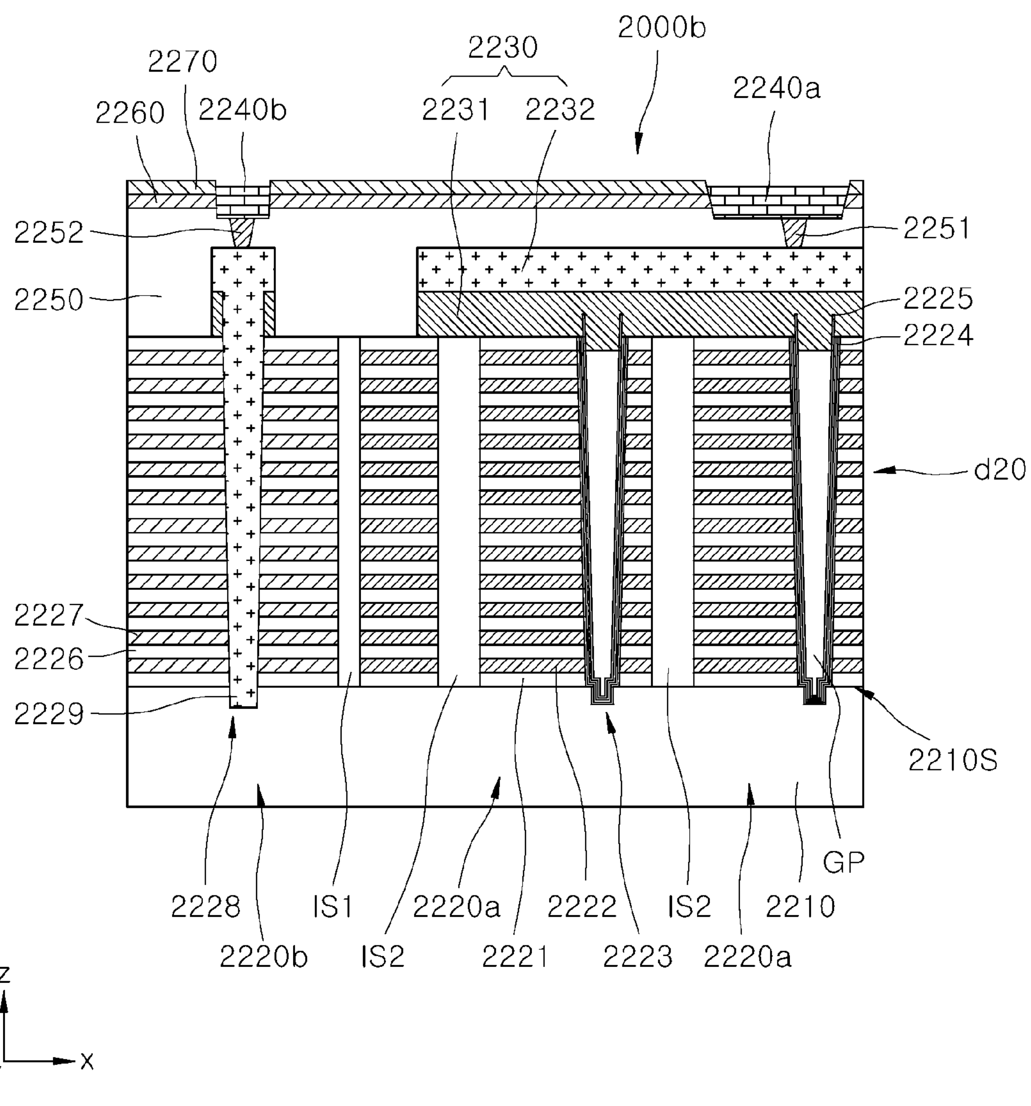
Figure 18:
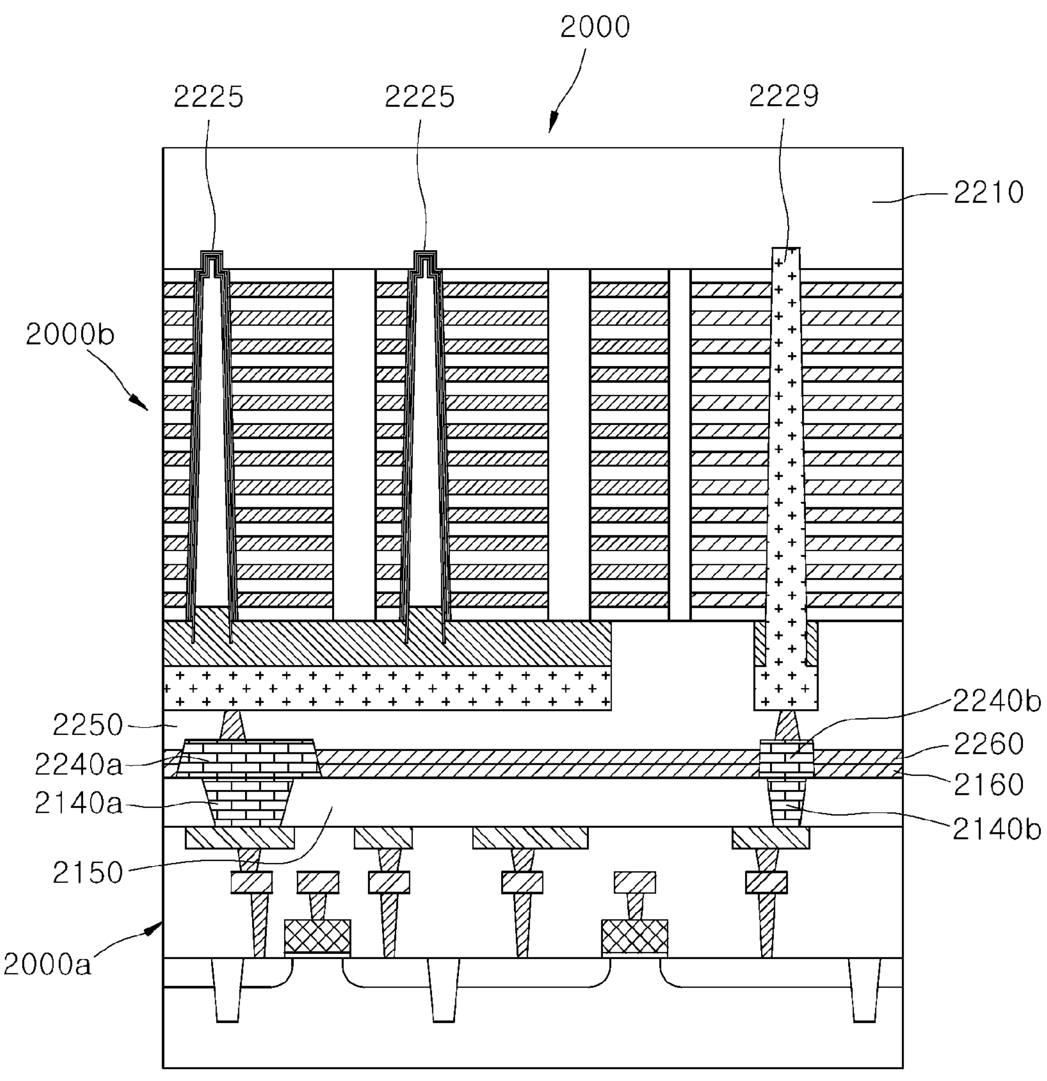
Figure 18:
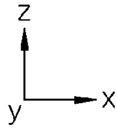

FIG. 16 to 18 are cross-sectional views schematically illustrating a method of fabricating a semiconductor device according to another embodiment of the present disclosure. FIGS. 16 to 18 may provide a method of fabricating a memory device 2000 by forming a first substrate structure 2000*a* including memory cell drive circuits and a second substrate structure 2000*b* including memory cell structures, and joining the first and second substrate structures 2000*a* and 2000*b*. In an embodiment, the memory device 2000 may be a NAND-type flash memory device.

Referring to FIG. 16, the first substrate structure 2000*a* may be provided. The first substrate structure 2000*a* may be fabricated over a first substrate 2110 through a semiconductor integration process. The first substrate structure 2000*a* may include the first substrate 2110, cell drive circuits a20 and b20 disposed over the first substrate 2110, first and second conductive connection structures 2140*a* and 2140*b* electrically connected to the memory cell drive circuits a20 and b20 over the substrate 2110, respectively, and a first two-dimensional inorganic layer 2160 disposed adjacent to the first conductive connection structures 2140*a* and 2140*b* and having negative charges.

The first substrate 2110 may be a known wafer to which a semiconductor integrated circuit process is applicable. For example, the first substrate 2110 may be a silicon wafer doped with an n-type dopant or a or p-type dopant. Although not illustrated, the first substrate 2110 may include n-type or p-type doped well regions.

Device isolation layers 2111 may be formed in the first substrate 2110 spaced apart from each other to define a plurality of active regions in the first substrate 2110. Each of the device isolation layers 2111 may include an oxide.

The memory cell drive circuits a20 and b20 may be formed over the first substrate 2110. In an embodiment, the memory cell drive circuits a20 and b20 may include a source line drive circuit a20 connected to a source line of the memory cell and a page buffer circuit b20, which is a peripheral circuit of the memory cell. Each of the source line drive circuit a20 and the page buffer circuit b20 may include a field effect transistor TR including first and second well regions 2112 and 2113, a gate dielectric layer 2114, and a gate electrode layer 2115. One of the first and second well regions 2112 and 2113 may function as a source region, and the other may function as a drain region.

In addition, an interlayer insulation structure 2130 covering the memory cell drive circuits a20 and b20 may be disposed over the first substrate 2110. The interlayer insulation structure 2130 may include at least one layer of insulation layer. Electrical wirings c20 may be disposed inside the interlayer insulation structure 2130. Each of the electrical wirings c20 may include first and second circuit pattern layers 2122 and 2124 disposed on different planes. In addition, each of the electrical wirings c20 may include a first contact plug 2121 electrically connecting the first circuit pattern layer 2122 to the first and second well regions 2112 and 2113, and a second contact plug 2123 electrically connecting the first and second circuit pattern layers 2122 and 2124 to each other.

The first conductive connection structures 2140*a* and 2140*b* may be formed on the interlayer insulation structure 2130. Each of the first conductive connection structures 2140*a* and 2140*b* may be electrically connected to at least a portion of the electrical wirings c20. As illustrated, the first conductive connection structures 2140*a* and 2140*b* may be electrically connected to at least one of the first and second well regions 2112 and 2113 through the electric wirings c20. A first passivation layer 2150 may be formed over the interlayer insulation structure 2130 to surround the side surfaces of the first conductive connection structures 2140*a* and 2140*b*.

The materials and properties of the first conductive connection structures 2140*a* and 2140*b* and the first passivation layer 2150 may be substantially the same as those of the first conductive connection structures 1150 and the first passivation layer 1120 described above with reference to FIG. 8.

In addition, a first two-dimensional inorganic layer 2160 having negative charges may be formed on the first passivation layer 2150. A material and property of the first two-dimensional inorganic layer 2160 may be substantially the same as those of the first two-dimensional inorganic layer 1140 described above with reference to FIG. 8.

Referring to FIG. 17, a second substrate structure 2000*b* may be provided. The second substrate structure 2000*b* may be fabricated on the second substrate 2210 through a semiconductor integration process. The second substrate structure 2000*b* may include the second substrate 2210, memory cell structures d20 disposed on the second substrate 2210, second conductive connection structures 2240*a* and 2240*b* electrically connected to the memory cell structures d20 over the substrate 2210, and a second two-dimensional inorganic layer 2260 disposed adjacent to the second conductive connection structures 2240 and having negative charges.

The second substrate 2210 may be a known wafer to which a semiconductor integrated circuit process is applicable. For example, the second substrate 2210 may be a silicon (Si) wafer doped with an n-type dopant or a p-type dopant. The second substrate 2210 may include well regions doped with an n-type dopant or a p-type dopant.

Each of the memory cell structures d20 may include a cell gate structure 2220*a* and a contact plug structure 2220*b* that are disposed to be spaced apart from each other in a direction parallel to a surface 2210S of the second substrate 2210. A first vertical insulation structure IS1 may be formed between the cell gate structure 2220*a* and the contact plug structure 2220*b*. The first vertical insulation structure IS1 may separate the cell gate structure 2220*a* and the contact plug structure 2220*b* from each other. A second vertical insulation structure IS2 may be formed between the adjacent cell gate structures 2220*a*. The second vertical insulation structure IS2 may separate the adjacent cell gate structures 2220*a* from each other.

Each of the cell gate structures 2220*a* may include gate electrode layers 2221 and interlayer insulation layers 2222 that are alternately stacked on the surface 2210S of the substrate 2210 in the z-direction vertical to the surface 2210S of the substrate 2210. Each of the memory cell structures d20 may include a memory functional layer 2224 and a channel layer 2225 that are disposed on a sidewall surface of a trench 2223 penetrating through the cell gate structure 2220*a* to expose the substrate 2210.

The memory functional layer 2224 may include a barrier insulation layer, a charge storage layer, and a charge tunneling layer that are sequentially formed from the sidewall surface of the trench 2223. The channel layer 2225 may be disposed on the memory functional layer 2224 and formed to protrude above the cell gate structure 2220*a*. The trench 2223 in which the memory functional layer 2224 and the channel layer 2225 are formed may be filled with an insulating gap-fill material GP.

A common source line structure 2230 may be disposed over the cell gate structure 2220*a*. In an embodiment, the common source line structure 2230 may include first and second conductive layers 2231 and 2232. The first conductive layer 2231 may be a doped semiconductor layer, and the second conductive layer 2232 may be a metal layer. As the first conductive layer 2231 contacts the channel layer 2225, the common source line structure 2230 may be electrically connected to the channel layer 2225.

The contact plug structure 2220*b* may include sacrificial insulation layers 2226 and interlayer insulation layers 2227 that are alternately stacked in the z-direction perpendicular to the surface 2210S of the substrate 2210. The sacrificial insulation layers 2226 may be disposed on the same levels as the gate electrode layers 2221 of the cell gate structure 2220*a*. The interlayer insulation layers 2227 may be disposed on the same levels as the interlayer insulation layers 2222 of the cell gate structure 2220*a*.

Each of the memory cell structures d20 may include a vertical contact plug 2229 that penetrates through the contact plug structure 2220*b* and fills a trench 2228 exposing the substrate 2210. The vertical contact plug 2229 may extend over the contact plug structure 2220*b*.

A second passivation layer 2250 may be formed to cover the common source line structure 2230 and the vertical contact plug 2229 over the cell gate structure 2220 and the contact plug structure 2220*b*.

Second conductive connection structures 2240*a* and 2240*b* may be formed on the second passivation layer 2250 to respectively contact first and second vias 2251 and 2252 formed in the second passivation layer 2250. One 2240*a* of the second conductive connection structures 2240*a* and 2240*b* may be electrically connected to the common source line structure 2230 through the first via 2251. The other 2240*b* of the second conductive connection structures 2240*a* and 2240*b* may be electrically connected to the vertical contact plug 2229 through the second via 2252.

A second two-dimensional inorganic layer 2260 having negative charges may be formed adjacent to the second conductive connection structures 2240*a* and 2240*b* in a lateral direction (that is, a direction perpendicular to the z-direction). The second two-dimensional inorganic layer 2260 may be formed to surround the sidewall surfaces of the second conductive connection structures 2240*a* and 2240*b*.

The materials and properties of the second passivation layer 2250, the second conductive connection structures 2240*a* and 2240*b*, and the second two-dimensional inorganic layer 2260 may be substantially the same as those of the second passivation layer 1220, the second conductive connection structure 1250, and the second two-dimensional inorganic layer 1240 described above with reference to FIG. 8.

n organic material 2270 having positive charges may be formed on the second two-dimensional inorganic layer 2260. A material and property of the organic material 2270 having positive charges may be substantially the same as those of the organic material 1260 having positive charges described above with reference to FIG. 9.

Referring to FIG. 18 together with FIGS. 16 and 17, the first substrate structure 2000*a* and the second substrate structure 2000*b* may be joined to each other to fabricate a semiconductor device 2000. Specifically, in a state where the corresponding first conductive connection structures 2140*a* and 2140*b* and the second conductive connection structures 2240*a* and 2240*b* are aligned with each other and the first two-dimensional inorganic layer 2160 and the second two-dimensional inorganic layer 2260 are aligned with each other, the first substrate structure 2000*a* and the second substrate structure 2000*b* may be in physical contact with each other. Subsequently, at least one of ultraviolet (UV) treatment and heat treatment may be performed on the organic material 2270 having positive charges to remove the organic material 2270 having positive charges. As a result, the corresponding first conductive connection structures 2140*a* and 2140*b* and the second conductive connection structures 2240*a* and 2240*b* may be joined to each other to form a first joint portion, and the first two-dimensional inorganic layer 2160 and the second two-dimensional inorganic layer 2260 may be joined to each other to form a second joint portion.

As described above, the semiconductor device 2000 may include a connection portion including the first joint portion and the second joint portion. A joint surface of the first joint portion may be located on a different plane from a joint surface of the second joint portion.

A bit line structure of the semiconductor device 2000 may be formed by performing the following subsequent process. In a state in which the first substrate structure 2000*a* and the second substrate structure 2000*b* are joined to each other, the second substrate 2210 may be removed from the surface in an inward direction to expose the channel layer 2225 and the vertical contact plug 2229. Subsequently, the bit line structure extending in a direction while contacting the exposed channel layer 2225 and the vertical contact plug 2229 may be formed.

In some embodiments, the organic material 2270 having positive charges may be formed on the first two-dimensional inorganic layer 2160 of the first substrate structure 2000*a*, not on the second two-dimensional inorganic layer 2260 of the second substrate structure 2000*b*. Subsequently, after forming the physical contact between the first substrate structure 2000*a* and the second substrate structure 2000*b*, at least one of the ultraviolet (UV) treatment and the heat treatment may be performed to remove the organic material 2270 having positive charges.

The method of joining the first substrate structure 2000*a* and the second substrate structure 2000*b* by using the organic material 2270 may be substantially the same as the method of joining the first and second substrate structures 1000*a* and 1000*b* described above with reference to FIGS. 9, 10, 11*a*, 11*b*, and 12.

In some embodiments, instead of the organic material 2270 having positive charges in FIG. 17, an inorganic material having positive charges may be formed on the second two-dimensional inorganic layer 2260 having negative charges. Next, the first substrate structure 2000*a* and the second substrate structure 2000*b* may be joined to each other by using the inorganic material having positive charges. The method of joining the first and second substrate structures 2000*a* and 2000*b* by using the inorganic material having positive charges may be substantially the same as the method of joining the first and second substrate structures 1000*a* and 1000*b* described above with reference to FIGS. 13, 14, and 15. In this case, the inorganic material having positive charges may remain even after joining the first and second substrate structures 2000*a* and 2000*b*. That is, as described above, in the semiconductor device 2000 including the first joint portion and the second joint portion, the second joint portion may further include an inorganic layer disposed between the first and second two-dimensional inorganic layers 2160 and 2260.

Figure 19:
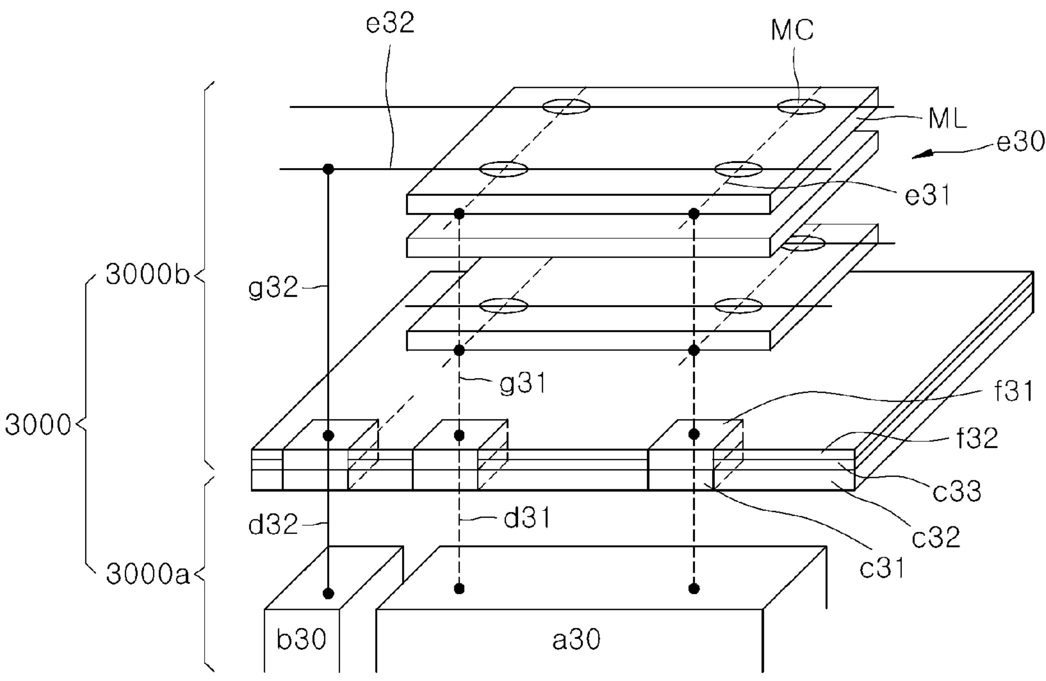
FIG. 19 is a cross-sectional view schematically illustrating a semiconductor device fabricated by a fabricating method according to yet another embodiment of the present disclosure.
Figure 19:
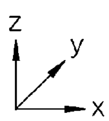

FIG. 19 is a cross-sectional view schematically illustrating a semiconductor device 3000 fabricated by a fabricating method according to yet another embodiment of the present disclosure. Referring to FIG. 19, the semiconductor device 3000 may be fabricated by a joining method of the first and second substrate structures 3000*a* and 3000*b* according to an embodiment of the present disclosure. In an embodiment, the semiconductor device 3000 may be a dynamic random-access memory (DRAM) device. In another embodiment, the semiconductor device 3000 may be a cross-point array device.

Referring to FIG. 19, the first substrate structure 3000*a* may include first and second memory cell drive circuits a30 and b30 disposed on a first substrate, and first conductive connection structures c31 disposed over the first substrate and electrically connected to the first and second memory cell drive circuits a30 and b30. The first conductive connection structures c31 may be electrically connected to the corresponding first and second memory cell drive circuits a30 and b30 by first and second electrical wirings d31 and d32.

The first substrate structure 3000*a* may include a passivation layer c32 disposed to surround a sidewall of the first conductive connection structure c31, and a first two-dimensional inorganic layer c33 disposed on the passivation layer c32 and having negative charges. The first and second memory cell drive circuits a30 and b30 may be disposed to be separated from each other.

The second substrate structure 3000*b* may include memory cell structures e30 disposed over the second substrate, second conductive connection structures f31 disposed over the substrate and electrically connected to the memory cell structures e30, and a second two-dimensional inorganic layer f32 disposed adjacent to the second conductive connection structure f31 and having negative charges.

Each of the memory cell structures e30 may include a plurality of memory cell layers ML. Each of the plurality of memory cell layer ML may include a memory cell MC disposed in a region where first and second electrode lines e31 and e32 intersect. In an embodiment, when the semiconductor device 3000 is a DRAM, the first and second electrode lines e31 and e32 may correspond to a word line and a bit line, respectively. In another embodiment, when the semiconductor device 3000 is a cross-point array device, the first and second electrode lines e31 and e32 may correspond to a source line and a bit line, respectively.

The second conductive connection structures f31 may be electrically connected to the corresponding first and second electrode lines e31 and e32 by third and fourth electrical wirings g31 and g32. As a result, the second conductive connection structures f31 may be electrically connected to the memory cell structures e30.

Referring to FIG. 19, the semiconductor device 3000 may include a connection portion including a first joint portion where the first and second conductive connection structures c31 and f31 are joined to each other and a second joint portion where the first and second two-dimensional inorganic layers are joined to each other. Each of the first and second conductive connection structures c31 and f31 may include a metal pattern structure. Each of the first and second two-dimensional inorganic layers e33 and f32 may include at least a layer of insulating two-dimensional material. A joint surface of the first joint portion may be located on a different plane from a joint surface of the second joint portion.

In some embodiments, the second joint portion may further include an inorganic material joint layer disposed between the first and second two-dimensional inorganic layers e33 and f32. That is, as in the joining method of the first and second substrate structures 1000*a* and 1000*b* described above with reference to FIGS. 13, 14 and 15, when joining the first and second substrate structures 3000*a* and 3000*b* by using an inorganic material having positive charges, the inorganic joint layer may be formed.

FIGS. 20 to 24 are cross-sectional views schematically illustrating a method of fabricating a semiconductor device according to yet another embodiment of the present disclosure. The method of fabricating a semiconductor device described in relation to FIGS. 20 to 24 may be applied to a method of fabricating a semiconductor package in which a plurality of semiconductor chips are stacked through joint of a first substrate structure 4000*a* on which a base chip is formed and a second substrate structure 4000*b* on which a core chip is formed.

Figure 20:
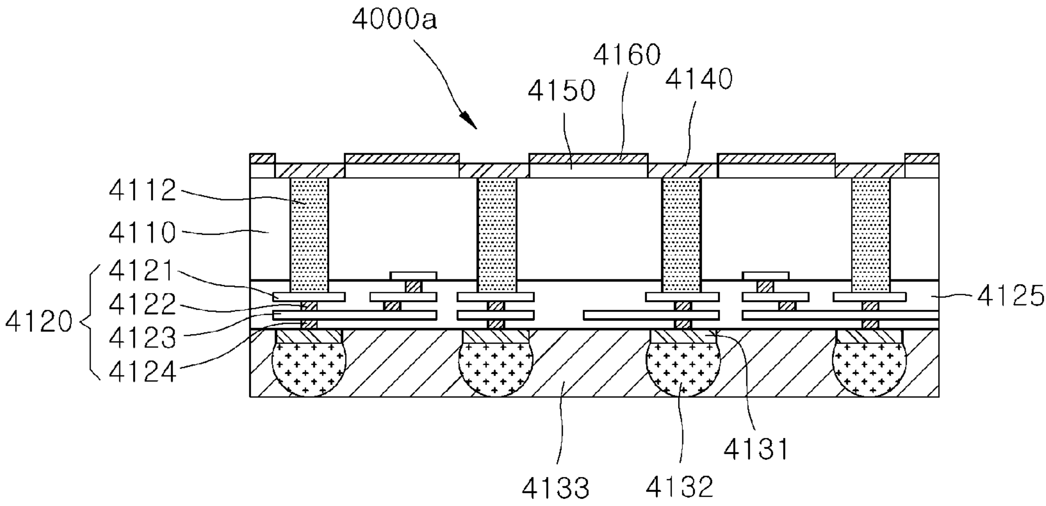
FIGS. 20 to 24 are cross-sectional views schematically illustrating a method of fabricating a semiconductor device according to further another embodiment of the present disclosure.
Figure 20:
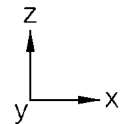

Referring to FIG. 20, the first substrate structure 4000*a* may be provided. The first substrate structure 4000*a* may include a first substrate body 4110 including first vias 4112, first wiring structures 4120 disposed on a surface of the first substrate body 4110 and respectively connected to the first vias 4112, connection pads 4131 respectively disposed on the first wiring structures 4120, first conductive connection structures 4140 disposed on another surface of the first substrate body 4110 and electrically connected to the first vias 4112, and first two-dimensional inorganic layers 4160 disposed adjacent to the first conductive connection structures 4140 and having negative charges.

The first substrate body 4110 may be a wafer to which a semiconductor integrated circuit process is applicable. Each of the first vias 4112 may be a through via penetrating the first substrate body 4110. The first vias 4112 may respectively connect the first wiring structures 4120 to the connection pads 4131.

The first wiring structures 4120 may be formed over the surface of the substrate body 4110 by the semiconductor process. Each of the first wiring structures 4120 may include first and second circuit pattern layers 4121 and 4123, first connection vias 4122 connecting the first and second circuit pattern layers 4121 and 4123 to each other, and second connection vias 4124 connecting the second circuit pattern layers 4123 to the corresponding connection pads 4131.

The first conductive connection structures 4140 may be disposed to contact the first vias 4112. A first passivation layer 4150 may be disposed to surround a sidewall surface of each of the first conductive connection structures 4140. A first two-dimensional inorganic layer 4160 having negative charges may be disposed on the first passivation layer 4150.

The materials and properties of the first conductive connection structures 4140, the first passivation layer 4150, and the first two-dimensional inorganic layer 4160 may be substantially the same as the materials and properties of the first conductive connection structures 1150, the first passivation layer 1120, and the first two-dimensional inorganic layer 1140 described with reference to FIG. 8.

Referring to FIG. 20, an interlayer insulation layer 4125 may be formed to cover a portion of each of the sidewalls of the first vias 4112, and the first wiring structures 4120 over the one surface of the first substrate body 4110. The connection pads 4131 may be disposed on the interlayer insulation layer 4125. Connection structures 4132 connected to an external system may be disposed on the connection pads 4131. Each of the connection structures 4132 may include, for example, a solder ball or a bump. The connection pads 4132 may be protected by a passivation layer 4133 formed on the interlayer insulation layer 4125.

Figure 21:
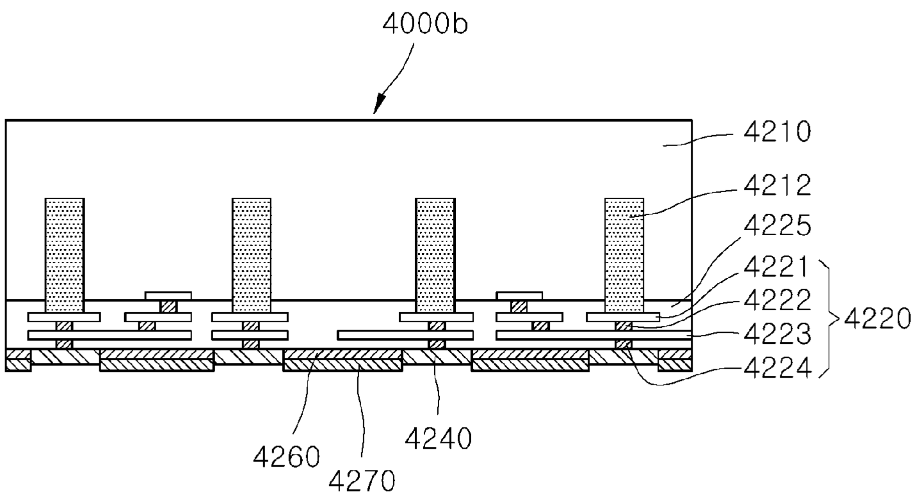
Figure 21:
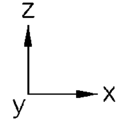

Referring to FIG. 21, the second substrate structure **4000*b* may be provided. The second substrate structure 4000*b* may include a second substrate body 4210 including second vias 4212, second wiring structures 4220 disposed on a surface of the second substrate body 4210 and connected to the second vias 4212, second conductive connection structures 4240 disposed on the second wiring structures 4220, and a second two-dimensional inorganic layer 4260 disposed adjacent to the second conductive connection structures 4240** and having negative charges.

The second substrate body 4210 may be a wafer to which a semiconductor integrated circuit process is applicable. The second vias 4212 may be formed such that a portion thereof is embedded in the second substrate body 4210 without passing through the second substrate body 4210.

The second wiring structures 4220 may be formed on the surface of the second substrate body 4210 by a semiconductor process. Each of the second wiring structures 4220 may include first and second circuit pattern layers 4221 and 4223, first connection vias 4222 connecting the first and second circuit pattern layers 4221 and 4223 to each other, and second connecting vias 4224 connecting the second circuit pattern layers 4224 to the second connection structures 4240.

Referring to FIG. 21, an interlayer insulation layer 4225 may be formed to cover portions of sidewalls of the second vias 4212 and the second wiring structures 4220 on the surface of the second substrate body 4210.

The second conductive connection structures 4240 may be disposed on the interlayer insulation layer 4225. A second two-dimensional inorganic layer 4260 may be disposed to contact portions of the second conductive connection structures 4240. An organic material 4270 having positive charges may be disposed on the second two-dimensional inorganic layer 4260.

The materials and properties of the second conductive connection structures 4240 and the second two-dimensional inorganic layer 4260 may be substantially the same as those of the second conductive connection structures 1250 and the second two-dimensional inorganic layer 1240 described above with reference to FIG. 8. The material and property of the organic material 4270 having positive charges may be substantially the same as those of the organic material 1260 having positive charges described abode with reference to FIG. 9.

Figure 22:
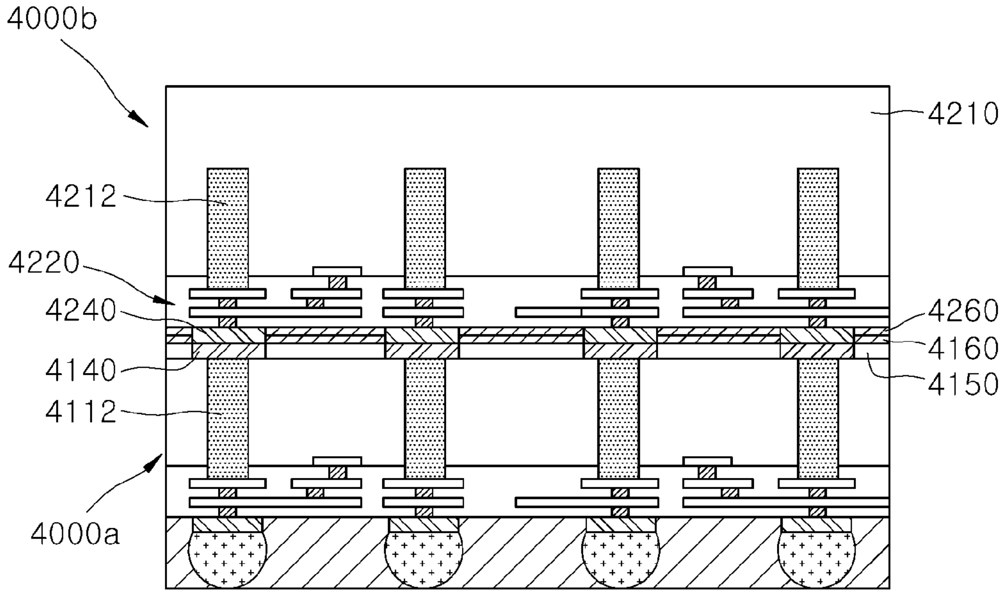
Figure 22:
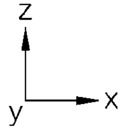

Referring to FIGS. 20 to 22 together, the first substrate structure **4000*a* and the second substrate structure 4000*b* may be joined to each other to fabricate a semiconductor device. Specifically, in a state in which the corresponding first conductive connection structures 4140 and the second conductive connection structures 4240 may be aligned with each other and the first two-dimensional inorganic layer 4160 and the second two-dimensional inorganic layer 4260 are aligned with each other, the first substrate structure 4000*a* and the second substrate structure 4000*b* may physically contact each other. Subsequently, at least one of ultraviolet (UV) treatment and heat treatment may be performed on the organic material 4270 having positive charges to remove the organic material 4270 having positive charges. As a result, the corresponding first conductive connection structures 4140 and the second conductive connection structures 4240 may be joined to each other to form a first joint portion, and the first two-dimensional inorganic layer 4160 and the second two-dimensional inorganic layer 4260** may be joined to each other to form a second joint portion.

As described above, the semiconductor device 4000 may include a connection portion including the first joint portion and the second joint portion. A joint surface of the first joint portion may be located on a different plane from a joint surface of the second joint portion.

Figure 23:
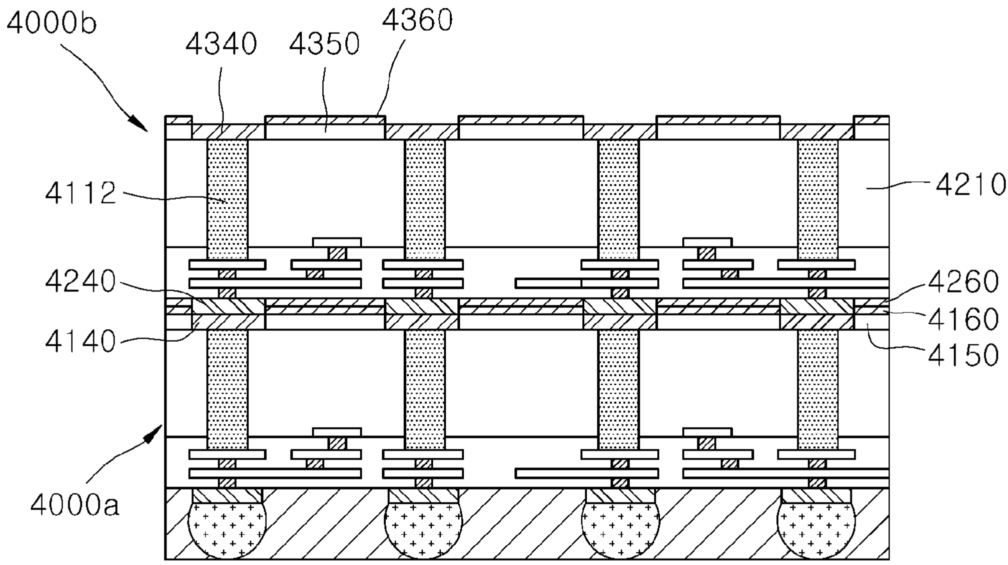
Figure 23:
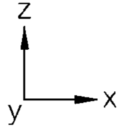

Referring to FIG. 23, the second substrate structure **4000*b* may be grinded inwardly from the other surface opposite to the one surface of the second substrate body 4210 to expose the second vias 4112. Next, third conductive connection structures 4340 electrically connected to the second vias 4112 and a third passivation layer 4350 surrounding sidewall surfaces of the third conductive connection structures 4340 may be formed. Then, a third two-dimensional inorganic layer 4360 having negative charges may be formed on the third passivation layer 4350**.

Figure 24:
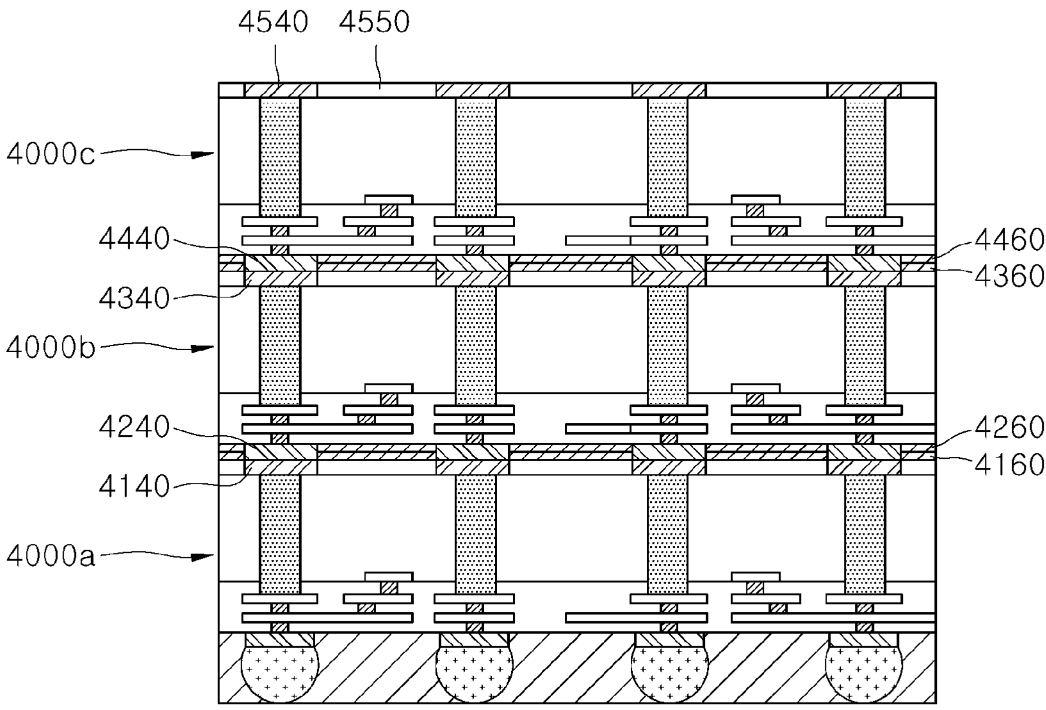
Figure 24:
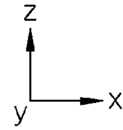

Referring to FIG. 24, a third substrate structure **4000*c* may be provided. A structure of the third substrate structure 4000*c* may be substantially the same as that of the second substrate structure 4000*b* illustrated in FIG. 21. The third substrate structure 4000*c* may be joined to the second substrate structure 4000*b* of FIG. 23. First conductive connection structures 4440 of the third substrate structure 4000*c* and the third connection structures 4340 of the second substrate structure 4000*b* may be joined to each other, and the first two-dimensional inorganic layer 4460 of the third substrate structure 4000*c* and the third two-dimensional material layer 4360 of the second substrate structure 4000*b* may be joined to each other. Subsequently, the substrate body of the third substrate structure 4000*c* may be grinded from the exposed surface and removed according to the process illustrated in FIG. 23, and conductive connection structures 4540 and a passivation layer 4550** may be formed.

As a result, the first substrate structure **4000*a*, the second substrate structure 4000*b*, and the third substrate structure 4000*c*** may be sequentially joined to each other to fabricate a semiconductor package.

In some embodiments, the organic material having positive charges of FIG. 21 may be formed on the first two-dimensional inorganic layer 4160 of the first substrate structure **4000*a* instead of the second two-dimensional inorganic layer 4260 of the second substrate structure 4000*b*. Subsequently, after forming the physical contact between the first substrate structure 4000*a*** and the second substrate structure

4000*b*, at least one of the ultraviolet (UV) treatment and the heat treatment may be performed, so that the organic material 4270 having positive charges may be removed.

The method of joining the first substrate structure 4000*a* and the second substrate structure 4000*b* by using the organic material 4270 having positive charges may be substantially the same as the method of joining the first and second substrate structures 1000*a* and 1000*b* described above with reference to FIGS. 9, 10, 11A, 11B, and 12.

In some embodiments, in FIG. 21, an inorganic material having positive charges may be formed on the second two-dimensional inorganic layer 4260 having negative charges instead of the organic material 4270 having positive charges. Next, the first substrate structure 4000*a* and the second substrate structure 4000*b* may be joined to each other by using the inorganic material having positive charges. The method of joining the first and second substrate structures 4000*a* and 4000*b* by using the inorganic material having positive charges may be substantially the same as the method of joining the first and second substrate structures 1000*a* and 1000*b* described above with reference to FIGS. 13, 14, and 15. In this case, the inorganic material having positive charges may remain as an inorganic material joint layer even after the first and second substrate structures 4000*a* and 4000*b* are joined to each other.

The semiconductor device fabricated by the method described with reference to FIGS. 20 to 24 may include a connection portion including a first joint portion in which the first and second conductive connection structures 4140 and 4240 are joined to each other, and a second joint portion in which the first and second two-dimensional inorganic layers 4160 and 4260 are joined to each other. Each of the first and second conductive connection structures 4140 and 4240 may include a metal pattern structure. Each of the first and second two-dimensional inorganic layers 4160 and 4260 may include at least one layer of insulating two-dimensional material. In an embodiment, a joint surface of the first joint portion may be located on a different plane from a joint surface of the second joint portion. In an embodiment, when an inorganic material having positive charges is applied in the joining process for the first substrate structure 4000*a* and the second substrate structure 4000*b*, the second joint portion may further include an inorganic joint layer disposed between the first and second two-dimensional inorganic layers.

According to various embodiments of the present disclosure, a first substrate structure including a first conductive connection structure and a first two-dimensional inorganic layer having negative charges, and a second substrate structure including a second conductive connection structure and a second two-dimensional inorganic layer having negative charges may be joined to each other to fabricate a semiconductor device. In this case, the first two-dimensional inorganic layer and the second two-dimensional inorganic layer may be aligned with each other using an organic material having positive charges or an inorganic material having positive charges. Through this, the first and second substrate structures may be joined to each other while reducing an alignment error between the first and second conductive connection structures.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of fabricating a semiconductor device, the method comprising:

providing a first substrate structure including a first substrate body, and a first conductive connection structure and a first two-dimensional inorganic layer disposed adjacent to each other over the first substrate body, the first two-dimensional inorganic layer having negative charges;

providing a second substrate structure including a second substrate body, and a second conductive connection structure and a second two-dimensional inorganic layer disposed adjacent to each other over the second substrate body, the second two-dimensional inorganic layer having negative charges; and joining the first and second substrate structures to each other such that the first conductive connection structure and the second conductive connection structure are connected to each other, and the first two-dimensional inorganic layer and the second two-dimensional inorganic layer are joined to each other, wherein joining the first and second substrate structure includes:

applying an organic material having positive charges on one of the first two-dimensional inorganic layer of the first substrate structure and the second two-dimensional inorganic layer of the second substrate structure;

aligning the first two-dimensional inorganic layer and the second two-dimensional inorganic layer with each other by using the organic material having positive charges and physically contacting the first and second substrate structures each other with the aligned first and second two-dimensional inorganic layers; and removing the organic material having positive charges and joining the first two-dimensional inorganic layer and the second two-dimensional inorganic layer to each other.

2. The method of claim 1, wherein providing the first substrate structure includes:

providing the first substrate body;

forming a first passivation layer over the first substrate body;

forming the first two-dimensional inorganic layer on the first passivation layer;

forming a first hole pattern penetrating the first two-dimensional inorganic layer and the first passivation layer over the first substrate body; and filling the first hole pattern with a conductive material to form the first conductive connection structure, and wherein an uppermost surface of the first conductive connection structure is located at a lower level than an uppermost surface of the first two-dimensional inorganic layer.

3. The method of claim 2, wherein forming the first two-dimensional inorganic layer includes:

applying an organic material having positive charges on the first passivation layer;

disposing a two-dimensional inorganic sheet having negative charges on the organic material having positive charges; and joining the two-dimensional inorganic sheet to the first passivation layer by performing at least one of ultraviolet (UV) treatment and heat treatment to remove the organic material.

4. The method of claim 1, wherein providing the second substrate structure includes:

providing the second substrate body;

forming a second passivation layer over the second substrate body;

forming the second two-dimensional inorganic layer on the second passivation layer;

forming a second hole pattern penetrating the second two-dimensional inorganic layer and the second passivation layer over the second substrate body; and filling the second hole pattern with a conductive material to form the second conductive connection structure, and wherein an uppermost surface of the second conductive connection structure is located at a higher level than an uppermost surface of the second two-dimensional inorganic layer.

5. The method of claim 4, wherein forming the second two-dimensional inorganic layer includes:

applying an organic material having positive charges on the second passivation layer;

disposing a two-dimensional inorganic sheet having negative charges on the organic material having positive charges; and joining the two-dimensional inorganic sheet to the second passivation layer by performing at least one of ultraviolet (UV) treatment and heat treatment to remove the organic material.

6. The method of claim 1, wherein the organic material having positive charges includes at least one selected from the group consisting of poly(acrylic acid) (PAA), poly(allylamine hydrochloride) (PAH), poly(anilinepropanesulfonic acid) (PAPSA), poly(dimethyl-diallylammonium chloride) (PDDA), poly(ethyleneimine) (PEI), poly(L-lysin)), poly(methacrylic acid) (PMA), poly(styrenesulfonate) (PSS), poly(vinylsulfonate) (PVS), poly-L-arginine (PLAr), and poly-L-histidine (PLH).

7. The method of claim 1, wherein removing the organic material having positive charges includes performing at least one of ultraviolet (UV) treatment and heat treatment for the organic material having positive charges.

8. The method of claim 1, wherein joining the first and second substrate structures includes:

applying an inorganic material having positive charges on one of the first two-dimensional inorganic layer of the first substrate structure and the second two-dimensional inorganic layer of the second substrate structure;

aligning the first two-dimensional inorganic layer and the second two-dimensional inorganic layer with each other by using the inorganic material having positive charges and physically contacting the first and second substrate structures each other with the aligned first and second two-dimensional inorganic layers; and performing one of ultraviolet (UV) treatment and heat treatment for the inorganic material having positive charges to form an insulating joint portion in which the first two-dimensional inorganic layer, the inorganic layer, and the second two-dimensional inorganic layer are sequentially stacked.

9. The method of claim 8, wherein the inorganic material having positive charges includes one selected from the group consisting of:

$AlO_4Al_{12}(OH)_{24}H_2O_{12}{}^{7+}$, $Al_2O_8Al_{28}(OH)_{56}(H_2O)_{26}{}^{18+}$, $A_{1-x}B_x(OH)_2{}^{x+}$ wherein 0<x<1, A is $Mg^{2+}$, $Co^{2+}$, $Ni^{2+}$, or $Zn^{2+}$ and B is $Al^{3+}$, $Co^{3+}$, or $Fe^{3+}$, and $RE(OH)_{2.5}(H_2O)^{0.5+}$ wherein RE is $Nd^{3+}$, $Sm^{3+}$, $Eu^{3+}$, $Gd^{3+}$, $Tb^{3+}$, $Dy^{3+}$, $Ho^{3+}$, or $Er^{3+}$.

10. The method of claim 1, wherein each of the first two-dimensional inorganic layer and the second two-dimensional inorganic layer includes one selected from the group consisting of $Ti_{0.91}O_2{}^{0.36-}$, $Ti_{0.87}O_2{}^{0.52-}$, $Ti_{0.8}Co_{0.2}O_2{}^{0.4-}$, $Ti_{0.6}Fe_{0.4}O_2{}^{0.4-}$, $MnO_2{}^{0.4-}$, $Nb_6O_{17}{}^{4-}$, $Nb_3O_8{}^{-}$, $TiNbO_5{}^{-}$, $Ti_5NbO_{14}{}^{3-}$, $TaO_3{}^{-}$, $RE_2Ti_3O_{10}{}^{2-}$ wherein RE is one of La, Pr, Sm, Nd, Eu, Gd, and Dy), $Bi_4Ti_3O_{12}{}^{2-}$, $LaNb_2O_7{}^{-}$, $SrTa_2O_7{}^{2-}$, $Ca_2Nb_3O_{10}{}^{-}$, $Sr_2Nb_3O_{10}{}^{-}$, and $W_2O_7{}^{2-}$.

11. The method of claim 1, wherein the first substrate structure includes a first wiring formed over the first substrate body and electrically connected to the first conductive connection structure, and wherein the second substrate structure includes a second wiring formed over the second substrate body and electrically connected to the second conductive connection structure.

* * * * *